US012696659B2

(12) United States Patent
Kim et al.

(10) Patent No.: US 12,696,659 B2
(45) Date of Patent: Jul. 28, 2026

(54) DISPLAY DEVICE

(71) Applicant: Samsung Display Co., Ltd., Yongin-si (KR)

(72) Inventors: Gee Bum Kim, Yongin-si (KR); Kwang Soo Bae, Yongin-si (KR); Bo Kwang Song, Yongin-si (KR); Byung Han Yoo, Yongin-si (KR); Dae Young Lee, Yongin-si (KR); Min Oh Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 638 days.

(21) Appl. No.: 18/062,945

(22) Filed: Dec. 7, 2022

(65) Prior Publication Data

US 2023/0292547 A1    Sep. 14, 2023

(30) Foreign Application Priority Data

Mar. 10, 2022    (KR) ........................ 10-2022-0030311

(51) Int. Cl.
| | |
|---|---|
| *H10K 59/80* | (2023.01) |
| *G06V 40/13* | (2022.01) |
| *H10K 50/80* | (2023.01) |
| *H10K 59/38* | (2023.01) |
| *H10K 59/40* | (2023.01) |

(52) U.S. Cl.
CPC ......... *H10K 59/87* (2023.02); *G06V 40/1318* (2022.01); *H10K 50/868* (2023.02); *H10K 59/38* (2023.02); *H10K 59/40* (2023.02); *H10K 59/8792* (2023.02)

(58) Field of Classification Search
CPC .. H10K 50/865; H10K 59/40; H10K 59/8792; H10K 39/34
See application file for complete search history.

(56) References Cited

U.S. PATENT DOCUMENTS

| | | | |
|---|---|---|---|
| 9,829,614 | B2 | 11/2017 | Smith et al. |
| 9,952,369 | B2 | 4/2018 | Son et al. |
| 10,664,676 | B2 | 5/2020 | Mackey et al. |
| 12,069,930 | B2 | 8/2024 | Hai et al. |

(Continued)

FOREIGN PATENT DOCUMENTS

| | | |
|---|---|---|
| CN | 112861763 A | 5/2021 |
| KR | 10-2015-0026061 A | 3/2015 |

(Continued)

*Primary Examiner* — Thanh Luu
(74) *Attorney, Agent, or Firm* — Womble Bond Dickinson (US) LLP

(57) ABSTRACT

A display device includes: a base layer; a pixel layer on the base layer, and including a light emitting element and a light receiving element; an encapsulation layer covering the pixel layer; a black matrix on the encapsulation layer, and having a first opening corresponding to the light receiving element, and a second opening corresponding to the light emitting element; a polarizing plate on the black matrix; a wavelength pattern on the polarizing plate to delay a phase of light, the wavelength pattern overlapping with the first opening in a thickness direction, and not overlapping with the second opening in the thickness direction; an adhesive layer on the polarizing plate and the wavelength pattern; and a window on the adhesive layer.

12 Claims, 17 Drawing Sheets

(56)　　　　　　References Cited

U.S. PATENT DOCUMENTS

| | | | |
|---|---|---|---|
| 2018/0151639 A1 | 5/2018 | Luo et al. | |
| 2018/0357462 A1* | 12/2018 | Mackey | H01L 25/167 |
| 2019/0294851 A1* | 9/2019 | Chung | G06F 3/042 |
| 2021/0050552 A1* | 2/2021 | Wang | H10K 59/871 |
| 2021/0167144 A1 | 6/2021 | Lim et al. | |
| 2021/0295008 A1 | 9/2021 | Lee | |
| 2021/0376003 A1* | 12/2021 | Xu | G06F 3/0412 |
| 2022/0271103 A1* | 8/2022 | Hai | G06V 10/147 |

FOREIGN PATENT DOCUMENTS

| | | |
|---|---|---|
| KR | 10-2016-0110672 A | 9/2016 |
| KR | 10-2019-0112624 A | 10/2019 |
| KR | 10-2021-0069776 A | 6/2021 |

* cited by examiner

<BEFORE IMPROVEMENT>

<AFTER IMPROVEMENT>

Figure 11A:
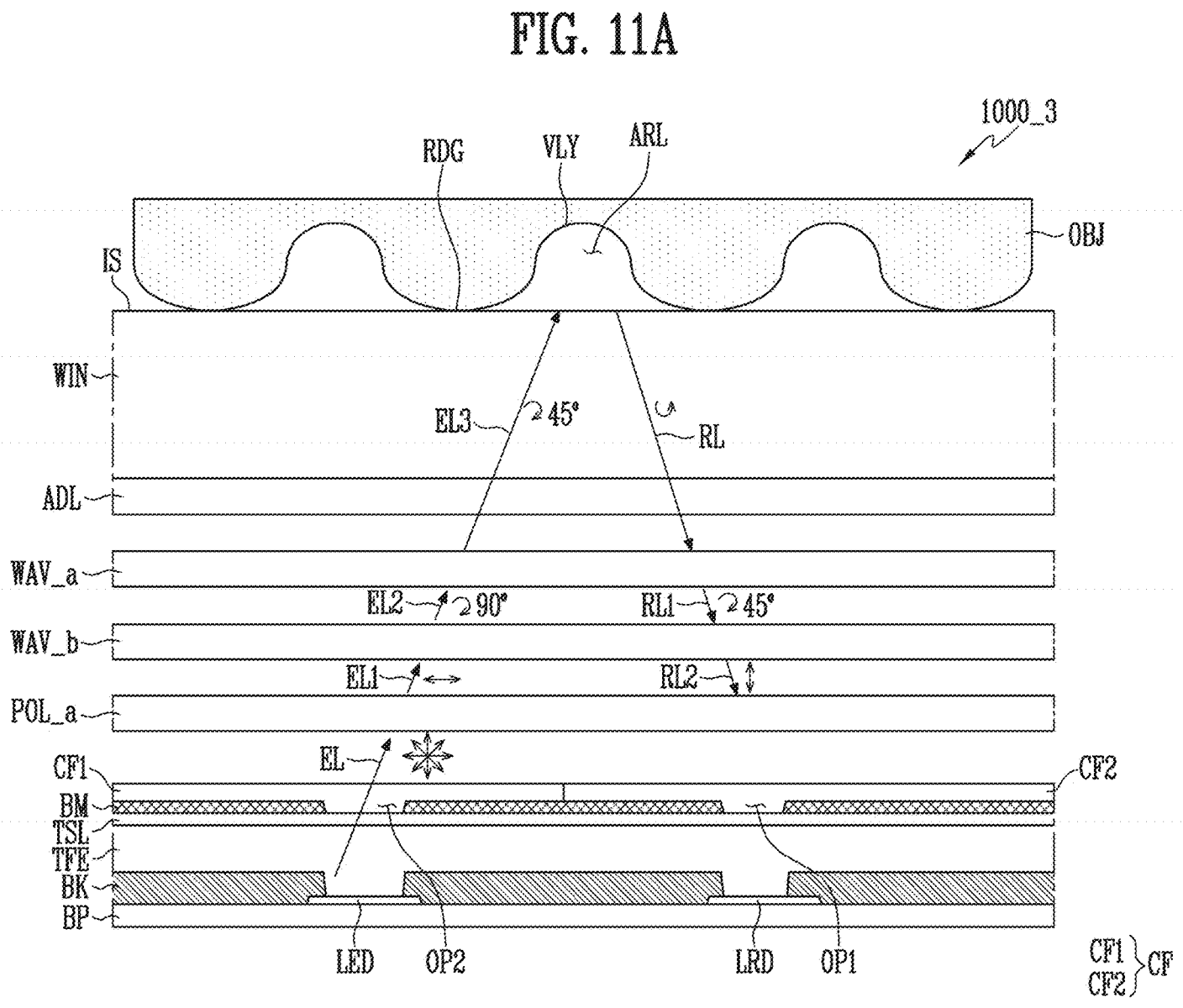

OBJ

IS

WIN

ADL

WAV_a

WAV_b

POL_a

CF1

BM

TSL

TFE

BK

BP

ARL

VLY

RDG

RL

EL3

45°

RL1 ~ 45°

RL2

EL2 ~ 90°

EL1

EL

CF2

OP1    LRD

OP2    LED

DISPLAY DEVICE

CROSS-REFERENCE TO RELATED APPLICATION

This application claims priority to and the benefit of Korean Patent Application No. 10-2022-0030311, filed on Mar. 10, 2022, the entire content of which is incorporated by reference herein.

BACKGROUND

1. Field

Aspects of embodiments of the present disclosure relate to a display device including a photo sensor.

2. Description of the Related Art

With the development of information technology, importance of a display device, which is a connection medium between a user and information, is being emphasized. In response to this, use of a display device, such as a liquid crystal display device and an organic light emitting display device, is increasing.

Among the display devices, an organic light emitting diode display device displays an image using an organic light emitting diode that generates light by recombination of an electron and a hole. The organic light emitting display device may be a self-emission display device, and unlike a liquid crystal display device, a polarizing plate may not be used. However, the organic light emitting display device may include a polarizing plate as desired, for example, to reduce external light reflection.

Recently, research and development on technology for combining and integrating a fingerprint sensor for recognizing a fingerprint or the like in a display panel occupying the largest area in the display device are being conducted.

The above information disclosed in this Background section is for enhancement of understanding of the background of the present disclosure, and therefore, it may contain information that does not constitute prior art.

SUMMARY

A fingerprint signal may be calculated based on a difference between a light amount corresponding to a ridge of the fingerprint and a light amount corresponding to a valley of the fingerprint. Unlike the ridge of the fingerprint, because an air layer may be interposed between the valley of the fingerprint and a cover window, interfacial reflection may occur more in an area corresponding to the valley of the fingerprint, and thus, the light amount corresponding to the valley of the fingerprint may be increased. Accordingly, because the difference of the light amount between the ridge and valley of the fingerprint may be reduced, a signal-to-noise ratio of the fingerprint signal may be reduced.

One or more embodiments of the present disclosure are directed to a display device capable of improving a signal-to-noise ratio of a fingerprint sensing signal by blocking interface reflection light.

However, the aspects and features of the present disclosure are not limited to those described above, and may be variously modified and/or expanded without departing from the spirit and scope of the present disclosure.

According to one or more embodiments of the present disclosure, a display device includes: a base layer; a pixel layer on the base layer, and including a light emitting element and a light receiving element; an encapsulation layer covering the pixel layer; a black matrix on the encapsulation layer, and having a first opening corresponding to the light receiving element, and a second opening corresponding to the light emitting element; a polarizing plate on the black matrix; a wavelength pattern on the polarizing plate and configured to delay a phase of light, the wavelength pattern overlapping with the first opening in a thickness direction, and not overlapping with the second opening in the thickness direction; an adhesive layer on the polarizing plate and the wavelength pattern; and a window on the adhesive layer.

In an embodiment, the wavelength pattern may be configured to delay the phase of light by 90 degrees.

In an embodiment, the polarizing plate may include: a phase retarder configured to delay a phase of light by 45 degrees; and a linear polarizer configured to transmit only a component from among components of light that vibrates in a 90 degree direction of a phase axis.

In an embodiment, the linear polarizer may be located between the phase retarder and the wavelength pattern.

In an embodiment, an area of the wavelength pattern may be greater than an area of the first opening.

In an embodiment, the display device may further include: a panel driver configured to supply a driving signal for fingerprint sensing to the light emitting element; and a sensor driver configured to calculate a fingerprint signal based on a difference between a light amount corresponding to a ridge of a fingerprint and a light amount corresponding to a valley of the fingerprint from a sensing signal received from the light receiving element.

In an embodiment, the light amount corresponding to the ridge of the fingerprint may be greater than a reflection light amount corresponding to the valley of the fingerprint.

In an embodiment, the display device may further include a touch sensor layer between the encapsulation layer and the black matrix.

According to one or more embodiments of the present disclosure, a display device includes: a base layer; a pixel layer on the base layer, and including a light emitting element and a light receiving element; an encapsulation layer covering the pixel layer; a black matrix on the encapsulation layer, and having a first opening corresponding to the light receiving element, and a second opening corresponding to the light emitting element; a color filter on the black matrix; a linear polarizer on the color filter; a first wavelength plate on the linear polarizer, and configured to delay a phase of light; and a window on the first wavelength plate.

In an embodiment, the first wavelength plate may be configured to delay the phase of light by 45 degrees.

In an embodiment, the linear polarizer may be configured to transmit only a component from among components of light that vibrates in a 90 degree direction of a phase axis.

In an embodiment, the linear polarizer may be located between the color filter and the first wavelength plate.

In an embodiment, the display device may further include a second wavelength plate between the first wavelength plate and the linear polarizer.

In an embodiment, the second wavelength plate may be configured to delay a phase of light by 90 degrees.

In an embodiment, the color filter may include: a first color filter corresponding to the light emitting element; and a second color filter corresponding to the light receiving element.

In an embodiment, the first color filter may be any one of a red color filter, a green color filter, or a blue color filter according to a color of light emitted from the light emitting element, and the second color filter may be the green color filter.

In an embodiment, the display device may further include a touch sensor layer between the encapsulation layer and the black matrix.

In an embodiment, the display device may further include an adhesive layer between the first wavelength plate and the window.

In an embodiment, the display device may further include: a panel driver configured to supply a driving signal for fingerprint sensing to the light emitting element; and a sensor driver configured to calculate a fingerprint signal based on a difference between a light amount corresponding to a ridge of a fingerprint and a light amount corresponding to a valley of the fingerprint from a sensing signal received from the light receiving element.

In an embodiment, the light amount corresponding to the ridge of the fingerprint may be greater than a reflection light amount corresponding to the valley of the fingerprint. The display device according to one or more embodiments of the present disclosure may improve a signal-to-noise ratio of the fingerprint signal by further including a wavelength plate between the polarizing plate and the cover window to reduce interface reflection light.

However, the aspects and features of the present disclosure are not limited to those described above, and may be variously modified and/or expanded without departing from the spirit and scope of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 4C is a diagram illustrating a path through which light emitted from a light emitting element exits to a display surface, and a path through which external light reflection is blocked in the display device of FIG. 3;

FIG. 5 is a cross-sectional view illustrating another embodiment of the display area of FIG. 1;

FIG. 6A is a diagram illustrating a path through which the interface reflection light is removed in a display device of FIG. 5;

FIG. 9A is a diagram illustrating a path through which the interface reflection light is removed in a display device of FIG. 8;

FIG. 9B is a diagram illustrating a path through which the scattered reflection light is incident on the light receiving element in the display device of FIG. 8;

FIG. 11A is a diagram illustrating a path through which the interface reflection light is removed in a display device of FIG. 10; and FIG. 11B is a diagram illustrating a path through which the scattered reflection light is incident on the light receiving element in the display device of FIG. 10.

DETAILED DESCRIPTION

Figure 1:
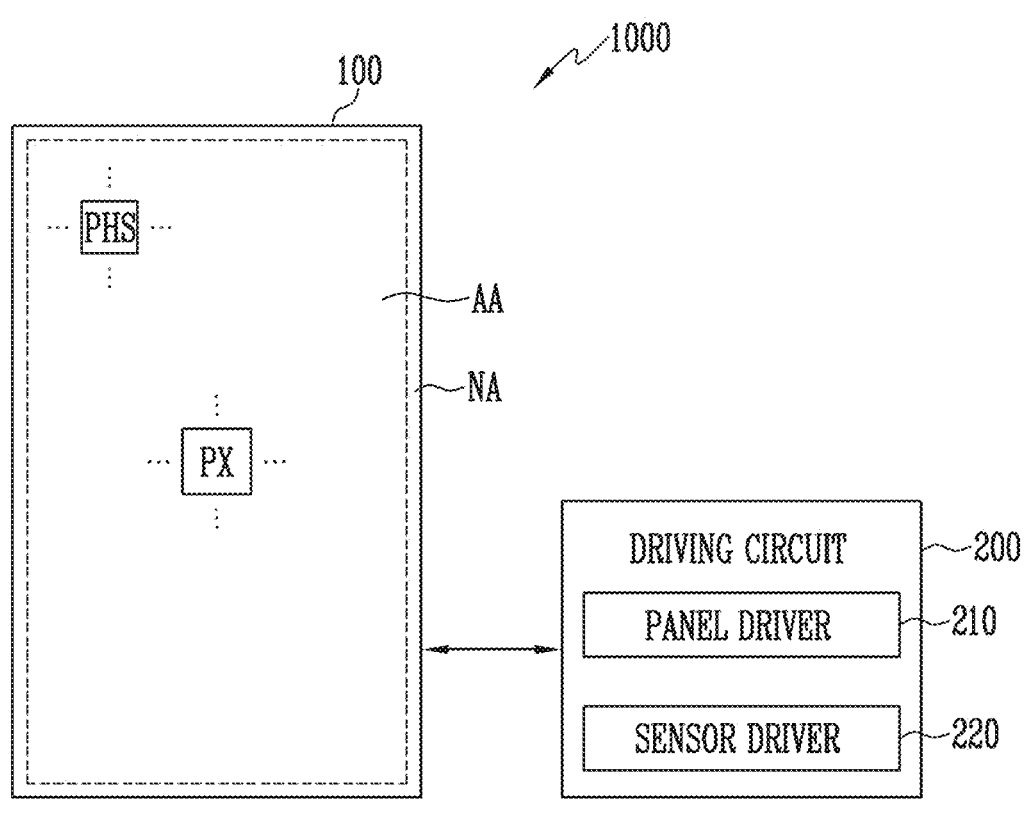
FIG. 1 is a block diagram illustrating a display device according to embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to embodiments of the present disclosure.

Referring to FIG. 1, the display device 1000 may include a display panel 100 and a driving circuit 200. In an embodiment, the driving circuit 200 may include a panel driver 210 and a sensor driver 220.

The display device 1000 may be implemented as a self-emission display device including a plurality of self-emission elements. In more detail, the display device 1000 may be an organic light emitting display device including organic light emitting elements. However, this is provided as an example, and in other embodiments, the display device 1000 may be implemented as a display device including inorganic light emitting elements, a display device including light emitting elements configured of an inorganic material and an organic material in complex, or the like.

The display device 1000 may be a flat or substantially flat display device, a flexible display device, a curved display device, a foldable display device, or a bendable display device. In addition, the display device may be applied to a transparent display device, a head-mounted display device, a wearable display device, or the like.

The display panel 100 may include a display area AA and a non-display area NA. The display area AA may be an area in which a plurality of pixels PX are provided. Each of the pixels PX may include at least one light emitting element. For example, the light emitting element may include a light emitting layer (e.g., an organic light emitting layer). A portion for emitting light by the light emitting element may be defined as a light emitting area. The display device 1000 may display an image at (e.g., in or on) the display area AA by driving the pixels PX in response to externally input image data.

In an embodiment, a photo sensor PHS (e.g., a sensor pixel) may be included at (e.g., in or on) the display area AA. The photo sensor PHS may include a light receiving element including a light receiving layer. The light receiving layer of the light receiving element may be disposed to be spaced apart from the light emitting layer of the light emitting element at (e.g., in or on) the display area AA.

In an embodiment, a plurality of photo sensors PHS may be distributed to be spaced apart from each other over an entire or substantially an entire area of the display area AA. However, this is provided as an example, and in other embodiments, only a portion of the display area AA may correspond to (e.g., may be set as) a sensing area (e.g., a predetermined sensing area), and the photo sensors PHS may be provided at (e.g., in or on) the corresponding sensing area. In addition, the photo sensor PHS may also be included at (e.g., in or on) at least a portion of the non-display area NA.

In an embodiment, the photo sensors PHS may sense when light emitted from a light source (e.g., such as the light emitting element) is reflected by an external object (e.g., such as a user's finger or the like). For example, a user's fingerprint may be sensed through the photo sensor PHS. Hereinafter, the present disclosure is described in more detail by using an example in which the photo sensors PHS are used for fingerprint sensing, but in various embodiments, the photo sensors PHS may sense various biometric information, such as an iris, a vein, and/or the like. In addition, the photo sensor PHS may sense external light, and may also perform a function of a gesture sensor, a motion sensor, a proximity sensor, an illuminance sensor, an image sensor, or the like.

The non-display area NA may be an area provided around the display area AA. In an embodiment, the non-display area NA may comprehensively refer to an area of the display panel 100 other than the display area AA. For example, the non-display area NA may include a line area, a pad area, various dummy areas, and the like.

The display device 1000 may include the panel driver 210 and the sensor driver 220. In FIG. 1, the panel driver 210 and the sensor driver 220 are illustrated as being separately implemented, but the present disclosure is not limited thereto. For example, at least a portion of the sensor driver 220 may be included in the panel driver 210, or may operate in conjunction with the panel driver 210.

The panel driver 210 may scan the pixels PX of the display area AA, and may supply a data signal corresponding to image data (e.g., an image) to the pixels PX. The display panel 100 may display an image corresponding to the data signal.

In an embodiment, the panel driver 210 may supply a driving signal for the fingerprint sensing to the pixels PX. Such a driving signal may be provided, so that the pixels PX emit light to operate as a light source for the photo sensor PHS. In an embodiment, the panel driver 210 may also supply the driving signal and/or another driving signal for the fingerprint sensing to the photo sensor PHS. However, this is provided as an example, and the driving signals for the fingerprint sensing may be provided by the sensor driver 220.

The sensor driver 220 may detect biometric information, such as a user's fingerprint, based on a sensing signal received from the photo sensors PHS. In an embodiment, the sensor driver 220 may also supply the driving signals to the photo sensor PHS and/or the pixel PX.

Figure 2:
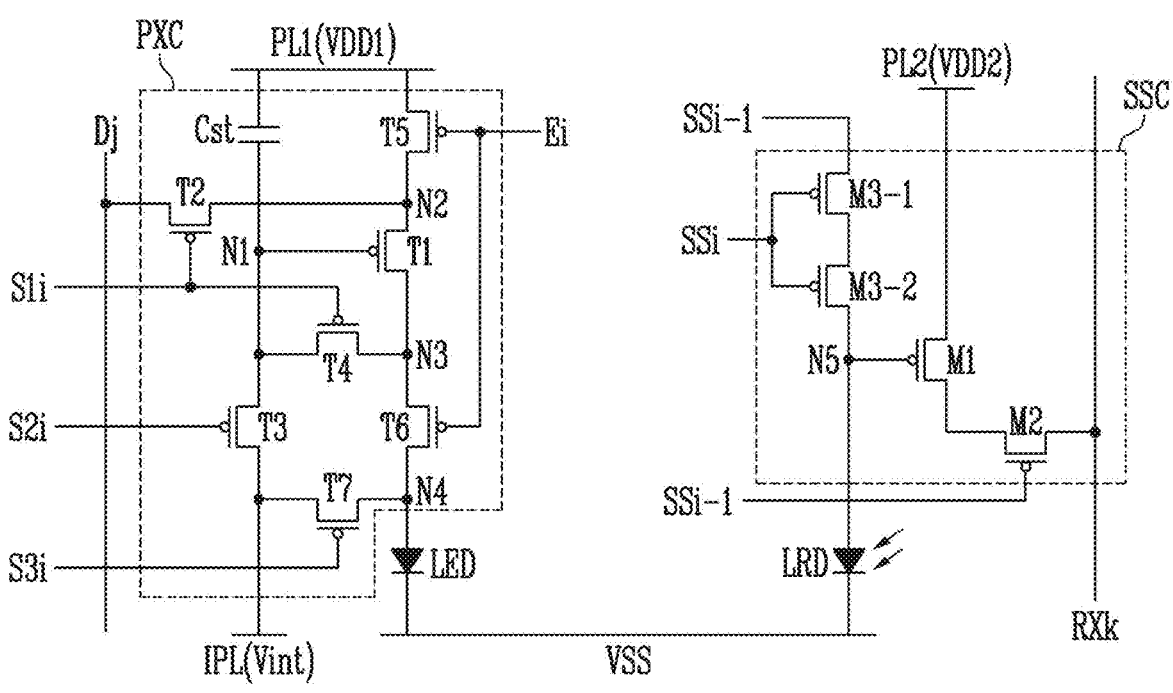
FIG. 2 is a circuit diagram illustrating an example of a pixel and a photo sensor included in the display device of FIG. 1.

FIG. 2 is a circuit diagram illustrating an example of the pixel and the photo sensor included in the display device of FIG. 1.

In FIG. 2, for convenience of illustration, a pixel PX positioned in an i-th pixel row (e.g., an i-th horizontal line) and connected to a j-th data line Dj, and a photo sensor PHS positioned in the i-th pixel row and connected to a k-th readout line RXk are shown (where i, j, and k are natural numbers).

Referring to FIGS. 1 and 2, the pixel PX may include a pixel circuit PXC, and a light emitting element LED connected to the pixel circuit PXC. The photo sensor PHS may include a sensor circuit SSC, and a light receiving element LRD connected to the sensor circuit SSC.

A first electrode (e.g., a first pixel electrode) of the light emitting element LED may be connected to a fourth node N4, and a second electrode (e.g., a second pixel electrode) may be connected to a second power VSS. The light emitting element LED may generate light having a desired luminance (e.g., a predetermined luminance) in response to an amount of current (e.g., a driving current) supplied from a first pixel transistor T1.

In an embodiment, the light emitting element LED may be an organic light emitting diode including an organic light emitting layer. In another embodiment, the light emitting element LED may be an inorganic light emitting element formed of an inorganic material. In another embodiment, the light emitting element LED may be a light emitting element configured of an inorganic material and an organic material in complex.

A first electrode (e.g., a first sensor electrode) of the light receiving element LRD may be connected to a fifth node N5, and a second electrode (e.g., a second sensor electrode) may be connected to the second power VSS. The light receiving element LRD may generate a carrier including a free electron and a hole based on intensity of light incident on a light receiving layer, and may generate a current (e.g., a photocurrent) by movement of the carrier.

The pixel circuit PXC may include the first pixel transistor T1, a second pixel transistor T2, a storage capacitor Cst, and the light emitting element LED. In an embodiment, the pixel circuit PXC may further include third to seventh pixel transistors T3 to T7.

The first pixel transistor T1 (e.g., a driving transistor) may be connected between a driving power line PL1, to which a voltage of driving power VDD1 (e.g., a first power) is applied, and the first electrode of the light emitting element LED. The first pixel transistor T1 may include a gate electrode connected to a first node N1.

The first pixel transistor T1 may control the amount of current (e.g., the driving current) flowing from the driving power VDD1 to the second power VSS via the light emitting element LED based on a voltage of the first node N1. In this case, the driving power VDD1 may be set to a voltage higher than that of the second power VSS.

The second pixel transistor T2 may be connected between the j-th data line Dj (hereinafter, referred to simply as a data line) and a second node N2. A gate electrode of the second pixel transistor T2 may be connected to an i-th first scan line S1i (hereinafter, referred to simply as a first scan line). The second pixel transistor T2 may be turned on when a first scan signal is supplied to the first scan line S1i to electrically connect the data line Dj and the second node N2 to each other.

The third pixel transistor T3 may be connected between the first node N1 and an initialization power line IPL for transmitting a voltage of an initialization power Vint. A gate electrode of the third pixel transistor T3 may be connected to an i-th second scan line S2i (hereinafter, referred to simply as a second scan line). The third pixel transistor T3 may be turned on by a second scan signal supplied to the second scan line S2i. When the third pixel transistor T3 is turned on, the voltage of the initialization power Vint may be supplied to the first node N1 (or in other words, to the gate electrode of the first pixel transistor T1). In an embodiment, a timing of the second scan signal supplied to the second scan line S2i may be the same or substantially the same as a timing of a scan signal supplied to an (i−1)-th first scan line S1i-1, or in other words, a first scan line of a previous pixel row.

The fourth pixel transistor T4 may be connected between the first node N1 and a third node N3. A gate electrode of the fourth pixel transistor T4 may be connected to the first scan line S1i. The fourth pixel transistor T4 may be turned on concurrently (e.g., simultaneously) with the second pixel transistor T2.

The fifth pixel transistor T5 may be connected between the driving power line PL1 and the second node N2. A gate electrode of the fifth pixel transistor T5 may be connected to an i-th emission control line Ei (hereinafter, referred to simply as an emission control line). The sixth pixel transistor T6 may be connected between the third node N3 and the light emitting element LED (e.g., the fourth node N4). A gate electrode of the sixth pixel transistor T6 may be connected to the emission control line Ei. The fifth pixel transistor T5 and the sixth pixel transistor T6 may be turned off when an emission control signal is supplied to the emission control line Ei, and may be turned on in other cases.

According to an embodiment, when the fifth and sixth pixel transistors T5 and T6 are turned on, a current flowing through the first pixel transistor T1 may be transmitted to the light emitting element LED, and the light emitting element LED may emit light.

The seventh pixel transistor T7 may be connected between the first electrode (e.g., the fourth node N4) of the light emitting element LED and the initialization power line IPL. A gate electrode of the seventh pixel transistor T7 may be connected to an i-th third scan line S3i (hereinafter, referred to simply as a third scan line). The seventh pixel transistor T7 may be turned on by a third scan signal supplied to the third scan line S3i to supply the voltage of the initialization power Vint to the first electrode of the light emitting element LED. In an embodiment, a timing of the third scan signal supplied to the third scan line S3i may be the same or substantially the same as a timing of one from among scan signals supplied to the first scan line S1i, the (i−1)-th first scan line S1i-1, or an (i+1)-th first scan line S1i+1. The (i+1)-th first scan line S1i+1 may be a first scan line of a next pixel row.

The storage capacitor Cst may be connected between the driving power line PL1 and the first node N1.

In an embodiment, the first scan signal may be supplied after the second scan signal is supplied. For example, the second scan signal and the first scan signal may be supplied with a difference therebetween of one horizontal period.

In an embodiment, the third scan signal may be supplied concurrently (e.g., simultaneously) with the first scan signal. However, this is provided as an example, and in other embodiments, the first scan signal may be supplied after the third scan signal is supplied. For example, a supply interval of the third scan signal and the first scan signal may be one horizontal period. As another example, the third scan signal may be supplied after the first scan signal is supplied.

The sensor circuit SSC may include a first sensor transistor M1, a second sensor transistor M2, and a third sensor transistor M3.

The first sensor transistor M1 and the second sensor transistor M2 may be connected in series between a sensing power line PL2 and the k-th readout line RXk (hereinafter, referred to simply as a readout line). A sensing power VDD2 may be supplied to the sensing power line PL2. For example, a voltage of the sensing power VDD2 may be different from the voltage of the driving power VDD1. However, this is provided as an example, and the voltages of the sensing power VDD2 and the driving power VDD1 may be the same or substantially the same as each other.

A gate electrode of the first sensor transistor M1 may be connected to the fifth node N5 (e.g., to the first sensor electrode of the light receiving element LRD). The first sensor transistor M1 may generate a sensing current flowing from the sensing power line PL2 to the readout line RXk based on a voltage of the fifth node N5 by the photocurrent generated by the light receiving element LRD.

In an embodiment, a gate electrode of the second sensor transistor M2 may be connected to an (i−1)-th sensing scan line SSi−1 (hereinafter, referred to simply as a previous sensing scan line). The second sensor transistor M2 may be turned on when a sensing scan signal is supplied to the previous sensing scan line SSi−1 to electrically connect the first sensor transistor M1 and the readout line RXk to each other. Then, a sensing signal (e.g., a sensing current) may be supplied to the sensor driver 220 through the readout line RXk.

The third sensor transistor M3 may be connected between the previous sensing scan line SSi−1 and the fifth node N5. A gate electrode of the third sensor transistor M3 may be connected to an i-th sensing scan line SSi (hereinafter, referred to simply as a sensing scan line). The third sensor transistor M3 may be turned on by a sensing scan signal supplied to the sensing scan line SSi to supply a voltage supplied to the previous sensing scan line SSi−1 to the fifth node N5. The third sensor transistor M3 may be used to reset (e.g., to initialize) a voltage of the fifth node N5.

In an embodiment, the third sensor transistor M3 may include a plurality of sub-transistors M3-1 and M3-2 connected in series.

In an embodiment, a timing of the sensing scan signal supplied to the sensing scan line SSi may be different from supply timings of the scan signals supplied to the first to third scan lines S1i, S2i, and S3i. However, this is provided as an example, and the sensing scan signal supplied to the sensing scan line SSi may be supplied at the same or substantially the same time point as that of one of the scan signals supplied to the first to third scan lines S1i, S2i, and S3i.

The pixel transistors T1 to T7 and the sensor transistors M1 to M3 may be P-type transistors (e.g., PMOS transistors), but are not limited thereto. For example, at least one of the pixel transistors T1 to T7 and the sensor transistors M1 to M3 may be implemented as an N-type transistor (e.g., an NMOS). When the pixel transistors T1 to T7 and the sensor transistors M1 to M3 are N-type transistors, positions of a source area (e.g., a source electrode) and a drain area (e.g., a drain electrode) may be reversed.

Figure 3:
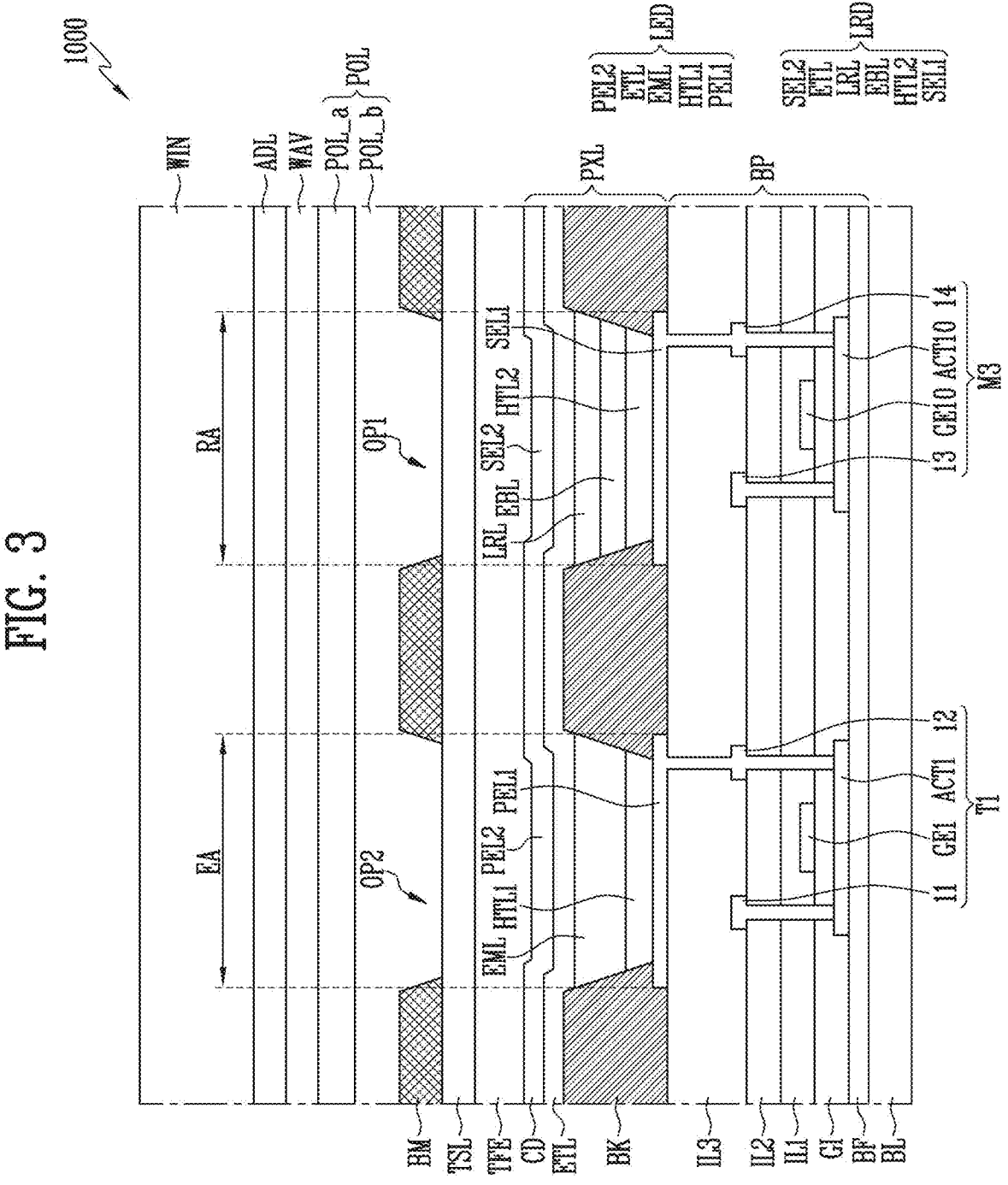
FIG. 3 is a cross-sectional view illustrating an embodiment of a display area of FIG. 1.

FIG. 3 is a cross-sectional view illustrating an embodiment of the display area of FIG. 1.

Referring to FIGS. 1 to 3, the display panel 100 of the display device 1000 may include a base layer BL, a backplane structure BP, a pixel layer PXL, and an encapsulation layer TFE. The display panel 100 may further include a touch sensor layer TSL, a black matrix BM, a polarizing plate POL, a wavelength plate WAV, an adhesive layer ADL, and a window WIN, which are on the encapsulation layer TFE. The black matrix BM may form an optical system for transmitting light to the light receiving element LRD.

The cross-sectional view of FIG. 3 shows a partial configuration of the pixel PX and the photo sensor PHS of FIG. 1. A configuration of the first pixel transistor T1 and the third sensor transistor M3 is described in more detail with reference to FIG. 3. The first pixel transistor T1 may be connected to the light emitting element LED via the sixth pixel transistor T6 as shown in FIG. 2, but in FIG. 3, for convenience of illustration, the first pixel transistor T1 is shown as being directly connected to the light emitting element LED.

The first pixel transistor T1 may include a first active pattern ACT1, a first gate electrode GE1, a first source electrode 11, and a first drain electrode 12. The third sensor transistor M3 may include a tenth active pattern ACT10, a tenth gate electrode GE10, a tenth source electrode 13, and a tenth drain electrode 14.

The base layer BL may be formed of an insulating material, such as glass or resin. In addition, the base layer BL may be formed of a suitable material having flexibility to be bent and/or folded, and may have a single layer structure or a multiple layered structure.

The backplane structure BP including the pixel circuit PXC and the sensor circuit SSC may be provided on the base layer BL. The backplane structure BP may include semiconductor layers including the first active pattern ACT1 and the tenth active pattern ACT10, conductive layers including the first gate electrode GE1, the tenth gate electrode GE10, the first source electrode 11, the first drain electrode 12, the tenth source electrode 13, and the tenth drain electrode 14, and insulating layers GI, IL1, IL2, and IL3.

A buffer layer BF may be formed on the base layer BL. The buffer layer BF may prevent or substantially prevent an impurity from diffusing into the transistors T1 and M3. However, the buffer layer BF may be omitted according to a material and a process condition of the base layer BL.

A semiconductor layer including the first active pattern ACT1 and the tenth active pattern ACT10 is provided on the buffer layer BF. In an embodiment, the semiconductor layer may include a polysilicon semiconductor. For example, the semiconductor layer may be formed through a low-tempera-ture poly-silicon process. However, this is provided as an example, and at least a portion of the semiconductor layer may be formed of an oxide semiconductor, a metal oxide semiconductor, or the like.

A gate insulating layer GI may be provided on the semiconductor layer. The gate insulating layer GI may be an inorganic insulating layer formed of an inorganic material.

A first conductive layer including the first gate electrode GE1 and the tenth gate electrode GE10 may be provided on the gate insulating layer GI. The first gate electrode GE1 may cover (e.g., may overlap with) an area corresponding to a channel area of the first active pattern ACT1. The tenth gate electrode GE10 may cover (e.g., may overlap with) an area corresponding to the channel area of the tenth active pattern ACT10.

The first conductive layer including the first gate electrode GE1 and the tenth gate electrode GE10 may be formed of a metal. For example, the first conductive layer may be formed of at least one metal, such as gold (Au), silver (Ag), aluminum (Al), molybdenum (Mo), chromium (Cr), tita-nium (Ti), nickel (Ni), neodymium (Nd), copper (Cu), or a suitable alloy of metals. In addition, the first conductive layer may be formed as a single layer or multiple layers, in which two or more materials of metals and/or alloys are stacked.

A first insulating layer IL1 (e.g., a first interlayer insulat-ing layer) may be provided on the first conductive layer. The first insulating layer IL1 may be an inorganic insulating layer formed of an inorganic material. As the inorganic material, polysiloxane, silicon nitride, silicon oxide, silicon oxynitride, or the like may be used.

A second conductive layer may be provided on the first insulating layer IL1. For example, the second conductive layer may include the readout line RXk shown in FIG. 2, an initialization power line IPL, and a sensing power line PL2. The second conductive layer may be formed of at least one metal, such as gold (Au), silver (Ag), aluminum (Al), molybdenum (Mo), chromium (Cr), titanium (Ti), nickel (Ni), neodymium (Nd), copper (Cu), or a suitable alloy of metals. In addition, the second conductive layer may be formed as a single layer, but is not limited thereto, and the second conductive layer may be formed as multiple layers, in which two or more materials from among metals and/or alloys are stacked.

A second insulating layer IL2 (e.g., a second interlayer insulating layer) may be provided on the second conductive layer. The second insulating layer IL2 may be an inorganic insulating layer formed of an inorganic material. As the inorganic material, polysiloxane, silicon nitride, silicon oxide, silicon oxynitride, or the like may be used.

A third conductive layer including the first source elec-trode 11, the first drain electrode 12, the tenth source electrode 13, and the tenth drain electrode 14 may be provided on the second insulating layer IL2. In FIG. 3, the first pixel transistor T1 and the third sensor transistor M3 are shown as P-type transistors, but the source electrode and the drain electrode may be variously modified according to a type or the like of the transistors.

The first source electrode 11 and the first drain electrode 12 may contact a source area and a drain area of opposite sides of the first active pattern ACT1, respectively, through contact holes formed in (e.g., penetrating) the gate insulating layer GI, the first insulating layer IL1, and the second insulating layer IL2.

The tenth source electrode 13 and the tenth drain elec-trode 14 may contact a source area and a drain area of opposite sides of the tenth active pattern ACT2, respectively, through contact holes formed in (e.g., penetrating) the gate insulating layer GI, the first insulating layer IL1, and the second insulating layer IL2.

The third conductive layer including the source electrodes 11 and 13 and the drain electrodes 12 and 14 may be formed of a metal. For example, the third conductive layer may be formed of at least one metal, such as gold (Au), silver (Ag), aluminum (Al), molybdenum (Mo), chromium (Cr), tita-nium (Ti), nickel (Ni), neodymium (Nd), copper (Cu), or a suitable alloy of metals.

In an embodiment, a passivation layer may be further included on the third conductive layer. The passivation layer may be an inorganic insulating layer formed of an inorganic material. As the inorganic material, polysiloxane, silicon nitride, silicon oxide, silicon oxynitride, or the like may be used.

A third insulating layer IL3 may be provided on the third conductive layer (e.g., or on the passivation layer). In an embodiment, the third insulating layer IL3 may be an organic insulating layer formed of an organic material. As the organic material, an organic insulating material may be used, such as a polyacryl-based compound, a polyimide-based compound, a fluorine-based carbon compound (e.g., such as Teflon), or a benzocyclobutene compound. In another embodiment, the third insulating layer IL3 may be an inorganic insulating layer formed of an inorganic mate-rial.

In FIG. 3, the third insulating layer IL3 is shown as being provided on the second insulating layer IL2, but a disposi-tion of the insulating layers may be variously modified. For example, only the passivation layer may be provided on the source and drain electrodes 11, 12, 13, and 14, and a first pixel electrode PEL1 and a first sensor electrode SEL1 may be provided on the passivation layer. As another example, an additional conductive layer and a fourth insulating layer covering the additional conductive layer may be provided, such that the first pixel electrode PEL1 and the first sensor electrode SEL1 may be provided on the fourth insulating layer.

The pixel layer PXL may be provided on the backplane structure BP. The pixel layer PXL may include the light emitting element LED connected to the pixel circuit PXC, and the light receiving element LRD connected to the sensor circuit SSC.

In an embodiment, the light emitting element LED may include the first pixel electrode PEL1, a first hole transport layer HTL1, a light emitting layer EML, an electron trans-port layer ETL, and a second pixel electrode PEL2. In an embodiment, the light receiving element LRD may include the first sensor electrode SEL1, a second hole transport layer HTL2, an electron blocking layer EBL, a light receiving layer LRL, the electron transport layer ETL, and a second sensor electrode SEL2.

In an embodiment, the first pixel electrode PEL1 and the first sensor electrode SEL1 may be formed of a metal layer, such as Ag, Mg, Al, Pt, Pd, Au, Ni, Nd, Ir, Cr, a suitable alloy thereof, indium tin oxide (ITO), indium zinc oxide (IZO), zinc oxide (ZnO), indium tin zinc oxide (ITZO), and/or the like. The first pixel electrode PEL1 may be connected to the first drain electrode 12 through a contact hole. The first sensor electrode SEL1 may be connected to the tenth drain electrode 14 through a contact hole.

The first pixel electrode PEL1 and the first sensor electrode SEL1 may be concurrently (e.g., simultaneously) formed with each other through patterning using a mask.

On the third insulating layer IL3 on which the first pixel electrode PEL1 and the first sensor electrode SEL1 are formed, a bank layer BK (e.g., a pixel defining layer) that partitions a light emitting area EA and a light receiving area RA may be provided. A portion where light is received by the light receiving element LRD may be defined as the light receiving area RA.

The bank layer BK may be an organic insulating layer formed of an organic material. The organic material may include an acryl resin, an epoxy resin, a phenolic resin, a polyamide resin, a polyimide resin, and/or the like.

In addition, the bank layer BK may include a light absorbing material, or a light absorbing agent may be applied to absorb light input from the outside. For example, the bank layer BK may include a carbon-based black pigment. However, the present disclosure is not limited thereto, and the bank layer BK may include chromium (Cr) having high light absorption, molybdenum (Mo), an alloy of molybdenum and titanium (MoTi), tungsten (W), vanadium (V), niobium (Nb), tantalum (Ta), manganese (Mn), cobalt (Co), or an opaque metal material (e.g., such as nickel (Ni)).

The bank layer BK may expose an upper surface of the first pixel electrode PEL1 and an upper surface of the first sensor electrode SEL1. The bank layer BK may be protruded from the third insulating layer IL3 along a perimeter of the light emitting area EA and a perimeter of the light receiving area RA. In other words, the bank layer BK may include openings corresponding to the light emitting area EA and the light receiving area RA.

The first hole transport layer HTL1 may be provided on the upper surface of the first pixel electrode PEL1 exposed by the bank layer BK, and the second hole transport layer HTL2 may be provided on the exposed upper surface of the first sensor electrode SEL1. A hole may move to the light emitting layer EML through the first hole transport layer HTL1, and a hole may move to the light receiving layer LRL through the second hole transport layer HTL2.

In an embodiment, the first hole transport layer HTL1 and the second hole transport layer HTL2 may be the same or substantially the same as each other, or may be different from each other according to materials of the light emitting layer EML and the light receiving layer LRL.

The light emitting layer EML may be provided on the first hole transport layer HTL1 at (e.g., in or on) the light emitting area EA surrounded (e.g., around a periphery thereof) by the bank layer BK. In an embodiment, the light emitting layer EML may be formed of an organic light emitting layer. According to an organic material included in the light emitting layer EML, the light emitting layer EML may emit light of red light, green light, blue light, or the like.

In an embodiment, as shown in FIG. 3, an electron blocking layer EBL may be provided on the second hole transport layer HTL2 at (e.g., in or on) the light receiving area RA surrounded (e.g., around a periphery thereof) by the bank layer BK. The electron blocking layer EBL may prevent or substantially prevent a charge of the light receiving layer LRL from being moved to the second hole transport layer HTL2. In an embodiment, the electron blocking layer EBL may include the same or substantially the same material as that of the first hole transport layer HTL1 of the light emitting area EA.

In an embodiment, the electron blocking layer EBL may be omitted as needed or desired.

The light receiving layer LRL may be disposed on the electron blocking layer EBL or on the second hole transport layer HTL2. The light receiving layer LRL may sense an intensity of light by emitting an electron in response to light of a specific wavelength band (e.g., a predetermined wavelength band).

In an embodiment, the light receiving layer LRL may include a low molecular organic material. For example, the light receiving layer LRL may be formed of a phthalocyanine compound including at least one or more metals selected from a group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

As another example, the low molecular organic material included in the light receiving layer LRL may be configured as a bi-layer including a layer including a phthalocyanine compound including at least one or more metals selected from a group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), and a layer including C60. As another example, the low molecular organic material may be configured as a single mixed layer, in which a phthalocyanine compound and C60 are mixed with each other.

However, the present disclosure is not limited thereto, and the light receiving layer LRL may include a polymer organic layer.

In FIG. 3, for convenience of illustration, the area of the light receiving area RA and the area of the light emitting area EA are shown as being similar with each other, but the area of the light receiving area RA may be smaller (e.g., less) than the area of the light emitting area EA. Therefore, presence of the light receiving area RA may not significantly affect light emission of the pixel PX for displaying an image, and image quality that is equal to or greater than a certain level may be guaranteed.

In an embodiment, the electron transport layer ETL may be provided on the light emitting layer EML and the light receiving layer LRL. The electron transport layer ETL may be integrally formed at (e.g., in or on) the display area AA. Therefore, the electron transport layer ETL may contact an upper surface of the bank layer BK.

However, the present disclosure is not limited thereto, and at least one of the first hole transport layer HTL1, the second hole transport layer HTL2, the electron blocking layer EBL, and the electron transport layer ETL may be omitted as needed or desired. In addition, a functional layer, such as a hole injection layer and/or an electron injection layer, may be further included as needed or desired.

The second pixel electrode PEL2 may be provided on the electron transport layer ETL of the light emitting area EA, and the second sensor electrode SEL2 may be provided on the electron transport layer ETL of the light receiving area RA. In an embodiment, the second pixel electrode PEL2 and the second sensor electrode SEL2 may be a common electrode CD integrally formed at (e.g., in or on) the display area AA. A voltage of the second power VSS (e.g., see FIG. 2) may be supplied to the second pixel electrode PEL2 and the second sensor electrode SEL2.

The second pixel electrode PEL2 and the second sensor electrode SEL2 may be formed of a metal layer, such as Ag, Mg, Al, Pt, Pd, Au, Ni, Nd, Ir, and/or Cr, and/or a transparent conductive layer, such as ITO, IZO, ZnO, and/or ITZO. In an embodiment, the common electrode CD may be formed as multiple layers of double layers or more including a thin metal layer, and may be formed as, for example, triple layers of ITO/Ag/ITO.

The encapsulation layer TFE may be provided on the common electrode CD including the second pixel electrode PEL2 and the second sensor electrode SEL2. The encapsulation layer TFE may be formed as a single layer, but may be formed as multiple layers. In an embodiment, the encapsulation layer TFE may have a stacked structure in which an inorganic material, an organic material, and an inorganic material are sequentially stacked (e.g., sequentially deposited). The uppermost layer of the encapsulation layer TFE may be formed of an inorganic material.

In an embodiment, the touch sensor layer TSL may be disposed on the encapsulation layer TFE. The touch sensor layer TSL may include a conductive pattern and an insulating layer for touch sensing. The conductive pattern of the touch sensor layer TSL may be formed as a single layer, or double layers formed with an insulating layer interposed therebetween.

In an embodiment, the conductive pattern of the touch sensor layer TSL may be disposed to avoid the light emitting area EA and the light receiving area RA, in order to secure image quality and a light reception amount.

The black matrix BM may be provided on the encapsulation layer TFE or the touch sensor layer TSL. The black matrix BM may absorb or block light input from the outside. The black matrix BM may include an organic light blocking material. For example, the organic light blocking material may include at least one of carbon black and titanium black, but is not limited thereto.

The black matrix BM may include a plurality of openings OP1 and OP2. In an embodiment, the black matrix BM may be formed by a patterning process using a mask, a printing process, or the like.

In an embodiment, the black matrix BM may be provided to overlap with the bank layer BK. In addition, the black matrix BM may be disposed to cover conductive patterns of the touch sensor layer TSL. The black matrix BM is disposed to avoid the light emitting area EA. For example, the black matrix BM may be provided in a form of a pattern including the second opening OP2 overlapping with the light emitting area EA.

The first opening OP1 of the black matrix BM may overlap with the light receiving area RA. The first opening OP1 of the black matrix BM may provide an optical path through which external light is incident on the light receiving layer LRL. For example, a vertical light component of the external light may be transmitted to the light receiving layer LRL through the first opening OP1.

In an embodiment, a polarizing plate POL (e.g., a polarizer) may be disposed on the touch sensor layer TSL and the black matrix BM. The polarizing plate POL may transmit only a component vibrating in a designated phase axis from among components of incident light, for example, such as light irradiated from the pixel layer PXL or incident light irradiated from a cover window WIN, to polarize the incident light.

According to an embodiment, the polarizing plate POL may include a linear polarizer POL_a and a phase retarder POL_b. For example, the polarizing plate POL may have a structure in which the phase retarder POL_b and the linear polarizer POL_a are sequentially stacked. The phase retarder POL_b may delay a phase of the incident light by 45 degrees. In addition, the linear polarizer POL_a may linearly polarize the incident light by transmitting only a component vibrating in one direction, for example, such as a 90 degree direction from among components of the incident light. As described above, the polarizing plate POL including the linear polarizer POL_a and the phase retarder POL_b, which delays the phase by 45 degrees, may be referred to as a circular polarizer.

In an embodiment, a wavelength plate WAV (e.g., a phase retarder) may be disposed on the polarizing plate POL. The wavelength plate WAV may delay a phase of the incident light, for example, such as light irradiated from the polarizing plate POL or light irradiated from the cover window WIN, by $\lambda*(N/4)$ (where N is 1, 3, 5, or 7). According to an embodiment, the wavelength plate WAV may delay the phase of the incident light by 45 degrees (e.g., $\lambda/4$). As the wavelength plate WAV is interposed between the polarizing plate POL and the cover window WIN, interface reflection light generated by interfacial reflection of the light irradiated from the pixel layer PXL on an upper surface of the cover window WIN may be blocked from being incident in a direction of the base layer BL, and only scattered reflection light generated when the light emitted from the pixel layer PXL collides with a valley or a ridge of the fingerprint may be incident in the direction of the base layer BL. This is described in more detail below with reference to FIGS. 4A to 4C.

In an embodiment, the cover window WIN may be included on the wavelength plate WAV. The cover window WIN serves to cover and protect structures disposed thereunder. The cover window WIN may be attached on the wavelength plate WAV by an adhesive layer ADL. For example, the adhesive layer ADL may include an optically clear adhesive (OCA), a super view resin (SVR), a pressure sensitive adhesive (PSA), or an optically clear resin (OCR).

The window WIN may be formed of a transparent material. The window WIN may include plastic, and in this case, the window WIN may have a flexible property.

An example of the plastic applicable to the window WIN may include polyimide, polyacrylate, polymethylmethacrylate, polycarbonate, polyethylene naphthalate, polyvinylidene chloride, polyvinylidene, polystyrene, ethylene vinylalcohol copolymer, polyethersulphone, polyetherimide, polyphenylene sulfide, polyallylate, tri-acetyl cellulose, cellulose acetate propionate, and/or the like, but is not limited thereto. The window WIN may include one or more of the plastic materials described above.

Figure 4A:
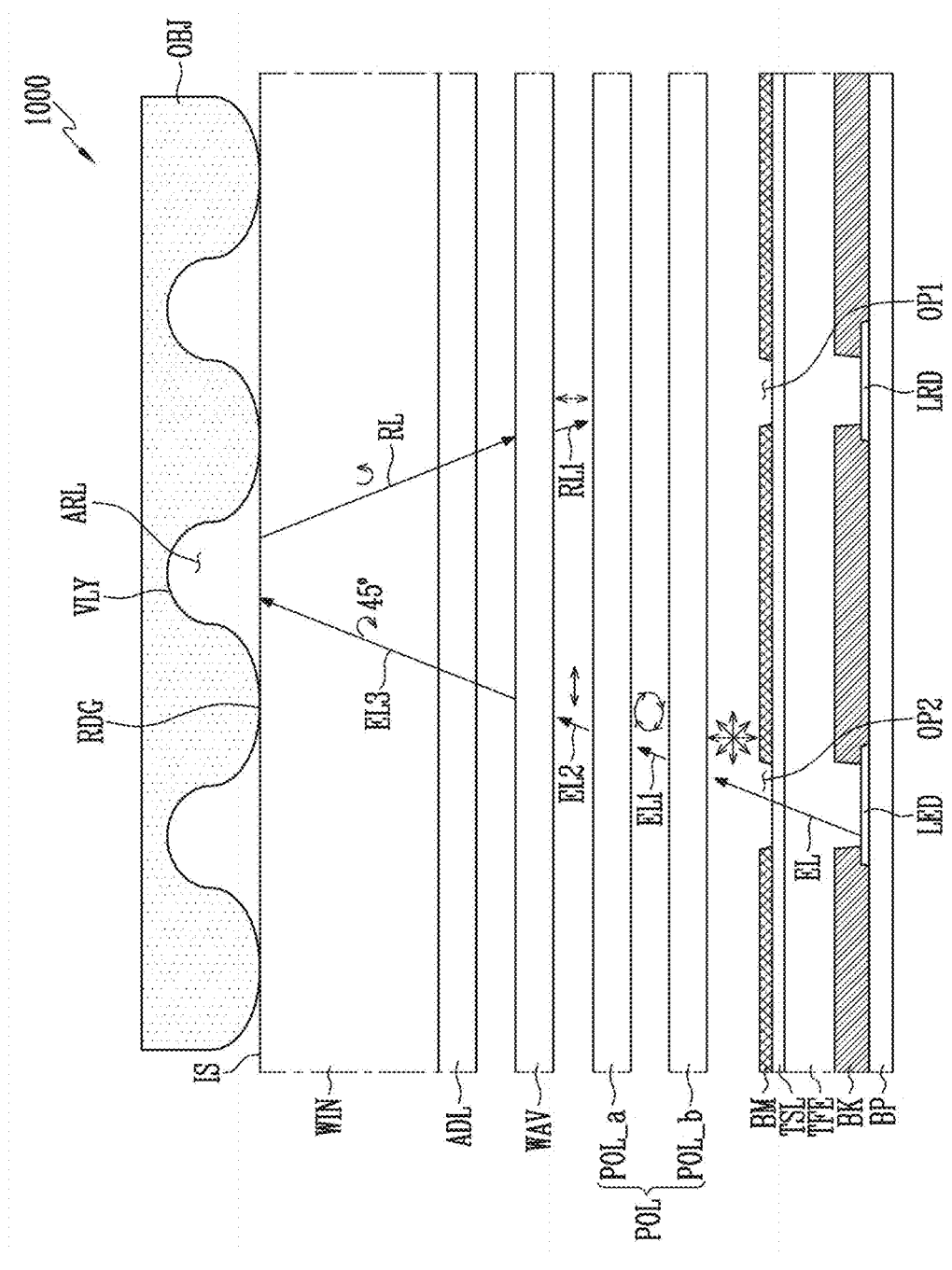
FIG. 4A is a diagram illustrating a path through which interface reflection light is removed in the display device of FIG. 3.
Figure 4B:
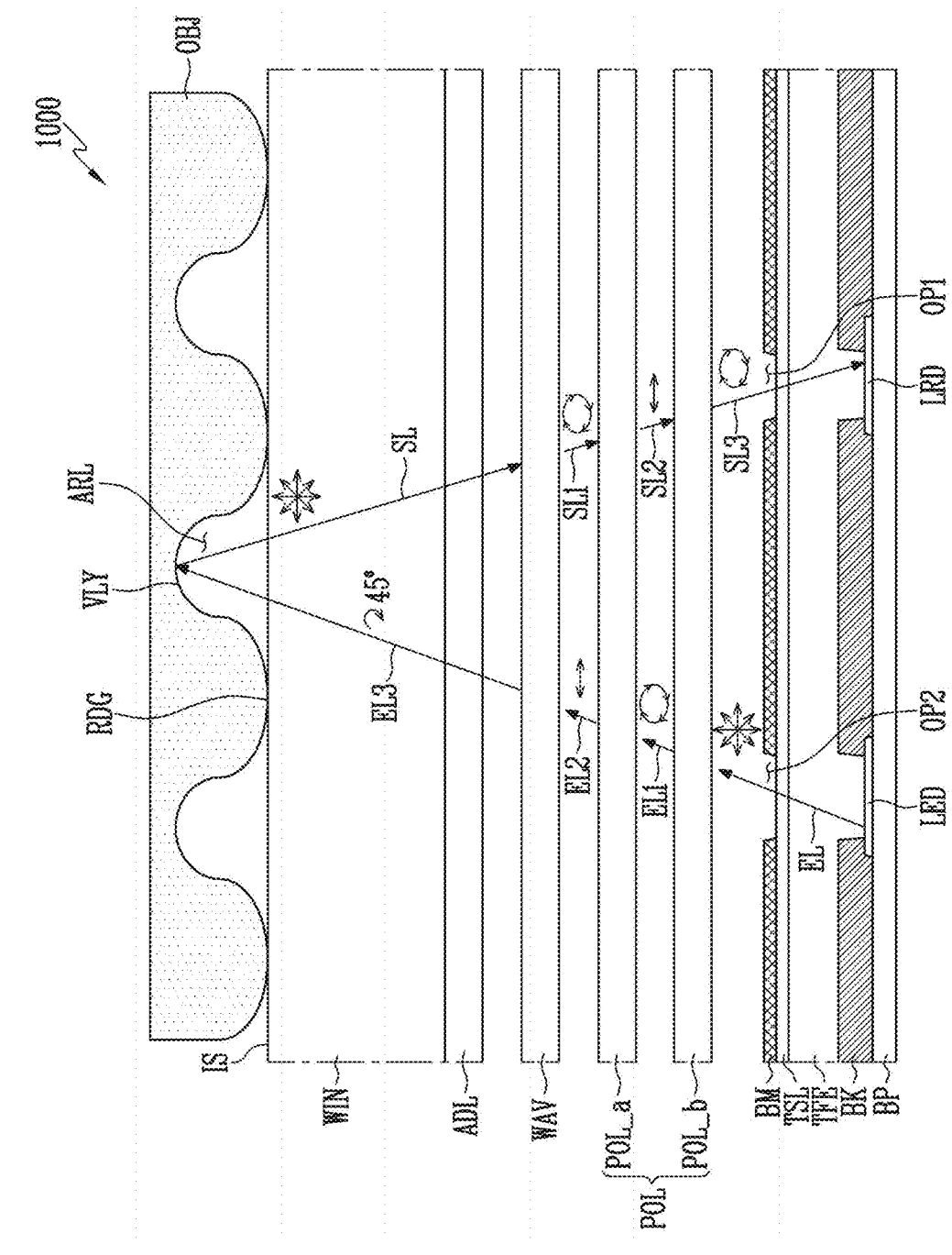
FIG. 4B is a diagram illustrating a path through which scattered reflection light is incident on a light receiving element in the display device of FIG. 3.
Figure 4C:
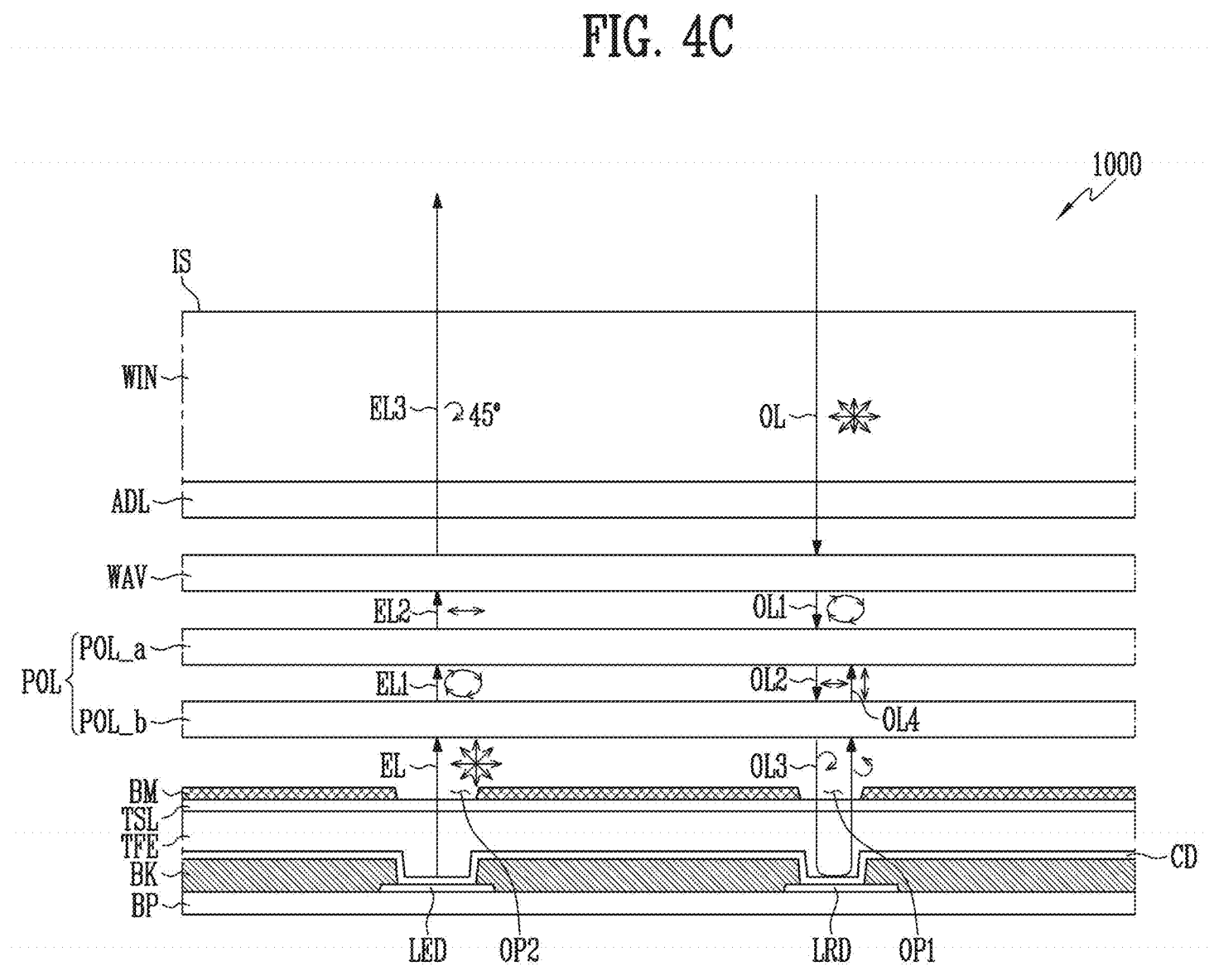

FIG. 4A is a diagram illustrating a path through which the interface reflection light is removed in the display device of FIG. 3. FIG. 4B is a diagram illustrating a path through which the scattered reflection light is incident on the light receiving element in the display device of FIG. 3. FIG. 4C is a diagram illustrating a path through which the light emitted from the light emitting element exits to a display surface, and a path through which external light reflection is blocked in the display device of FIG. 3.

Referring to FIG. 4A, a phase of emission light EL emitted from the light emitting element LED may be delayed while the emission light EL passes through the phase retarder POL_b of the polarizing plate POL. For example, the phase retarder POL_b may delay the phase of the emission light EL by 45 degrees.

Light EU output from the phase retarder POL_b may be incident on the linear polarizer POL_a. The linear polarizer POL_a may transmit only a component vibrating in a 90 degree direction of a phase axis from among components of the light EL1. Accordingly, light EL2 output from the linear polarizer POL_a may vibrate in the 90 degree direction.

The wavelength plate WAV (e.g., the phase retarder) that delays the phase of light by 45 degrees may delay a polarization state of the light EL2 having a linear polarization of 90 degrees by 45 degrees. Accordingly, light EL3 having a circular polarization of 135 degrees may be output from the wavelength plate WAV.

Unlike a ridge RDG of an object OBJ (e.g., a fingerprint of a finger) that is in contact with one surface of the cover window WIN, an air layer ARL may be interposed between a valley VLY of the object OBJ and the cover window WIN. The light EL3 output from the wavelength plate WAV may be interface-reflected by a rapid refractive index difference between one surface (e.g., a display surface IS) of the cover window WIN and the air layer ARL, or in other words, a difference of a refractive index of an interface. The interface reflection light RL may have a phase of 135 degrees. The interface reflection light RL may be incident on the wavelength plate WAV, and the wavelength plate WAV may delay a phase of the interface reflection light RL by 45 degrees. Accordingly, light RL1 having a linear polarization of 180 degrees may be output from the wavelength plate WAV.

The light RL1 output from the wavelength plate WAV may be incident on the linear polarizer POL_a. However, the linear polarizer POL_a may transmit only a component vibrating in a 90 degree direction of a phase axis of incident light, or in other words, of the light RL1. However, because the light RL1 vibrates in a 180 degree direction, the light RL1 may not pass through the linear polarizer POL_a. According to such an optical mechanism, in the display device 1000 according to one or more embodiments of the present disclosure, the reflection light RL that is interface-reflected from the upper surface of the cover window WIN may be blocked.

Referring to FIG. 4B, the emission light EL emitted from the light emitting element LED may pass through the polarizing plate POL and the wavelength plate WAV, as described above with reference to FIG. 4A. The light EL3 output from the wavelength plate WAV may pass through a surface between one surface (e.g., the display surface IS) of the cover window WIN and the air layer ARL, or in other words, an interface, to collide with the valley VLY or the ridge RDG of the object OBJ, and thus, may be scatter-reflected. The scattered reflection light SL may not only vibrate in a specific direction, like that of the light EL3 output from the wavelength plate WAV, but may vibrate in multiple directions (e.g., all directions).

The scattered reflection light SL may be incident on the cover window WIN, and the scattered reflection light SL incident on the cover window WIN may be delayed by 45 degrees while passing through the wavelength plate WAV.

Light SL1 output from the wavelength plate WAV may be incident on the linear polarizer POL_a. The linear polarizer POL_a may transmit only a component vibrating in a 90 degree direction of a phase axis from among components of the light SL1. Accordingly, light SL2 output from the linear polarizer POL_a may vibrate in the 90 degree direction.

The light SL2 output from the linear polarizer POL_a may be incident on the phase retarder POL_b, and the phase retarder POL_b may delay a polarization state of the light SL2 having a linear polarization of 90 degrees by 45 degrees. Accordingly, light SL3 having a circular polarization of 135 degrees may be output from the phase retarder POL_b.

The light SL3 output from the polarizing plate POL may be provided to the light receiving element LRD through the first opening OP1 of the black matrix BM. The sensor driver 220 shown in FIG. 1 may detect biometric information, such as a user's fingerprint, based on a sensing signal received from the light receiving element LRD.

Referring to FIG. 4C, the emission light EL emitted from the light emitting element LED may pass through the polarizing plate POL and the wavelength plate WAV, as described above with reference to FIG. 4A. The light EL3 output from the wavelength plate WAV may pass through one surface of the cover window WIN, and may be emitted to the outside. In other words, the one surface of the cover window WIN may form the display surface IS.

On the other hand, external light OL may be incident on the cover window WIN from the outside. The external light OL may not only vibrate in a specific direction, but may vibrate in multiple directions (e.g., all directions).

The external light OL passing through the cover window WIN may be incident on the wavelength plate WAV. A phase of the external light OL may be delayed by 45 degrees while the external light OL passes through the wavelength plate WAV.

Light OL1 output from the wavelength plate WAV may be incident on the linear polarizer POL_a. The linear polarizer POL_a may transmit only a component vibrating in a 90 degree direction of a phase axis from among components of the light OL1. Accordingly, light OL2 output from the linear polarizer POL_a may vibrate in the 90 degree direction.

The light OL2 output from the linear polarizer POL_a may be incident on the phase retarder POL_b, and the phase retarder POL_b may delay a polarization state of the light OL2 having a linear polarization of 90 degrees by 45 degrees. Accordingly, light OL3 having a circular polarization of 135 degrees may be output from the phase retarder POL_b.

The light OL3 output from the polarizing plate POL may be reflected by the common electrode CD. The light OL3 reflected by the common electrode CD may have a phase of 135 degrees. The light OL3 may be incident on the phase retarder POL_b, and the phase retarder POL_b may delay a phase of the light OL3 by 45 degrees. Accordingly, light OL4 having a linear polarization of 180 degrees may be output from the phase retarder POL_b.

The light OL4 output from the phase retarder POL_b may be incident on the linear polarizer POL_a. However, the linear polarizer POL_a may transmit only a component vibrating in a 90 degree direction of a phase axis of incident light, or in other words, the light OL4. However, because the light OL4 vibrates in a 180 degree direction, the light OL4 may not pass through the linear polarizer POL_a. According to such an optical mechanism, the display device 1000 according to one or more embodiments of the present disclosure may block external light reflection.

Hereinafter, other embodiments of the present disclosure are described in more detail. Hereinafter, redundant description of the same or substantially the same components as those of one or more previously described embodiments may not be repeated or may be simplified, and differences therebetween may be mainly described in more detail.

Figure 5:
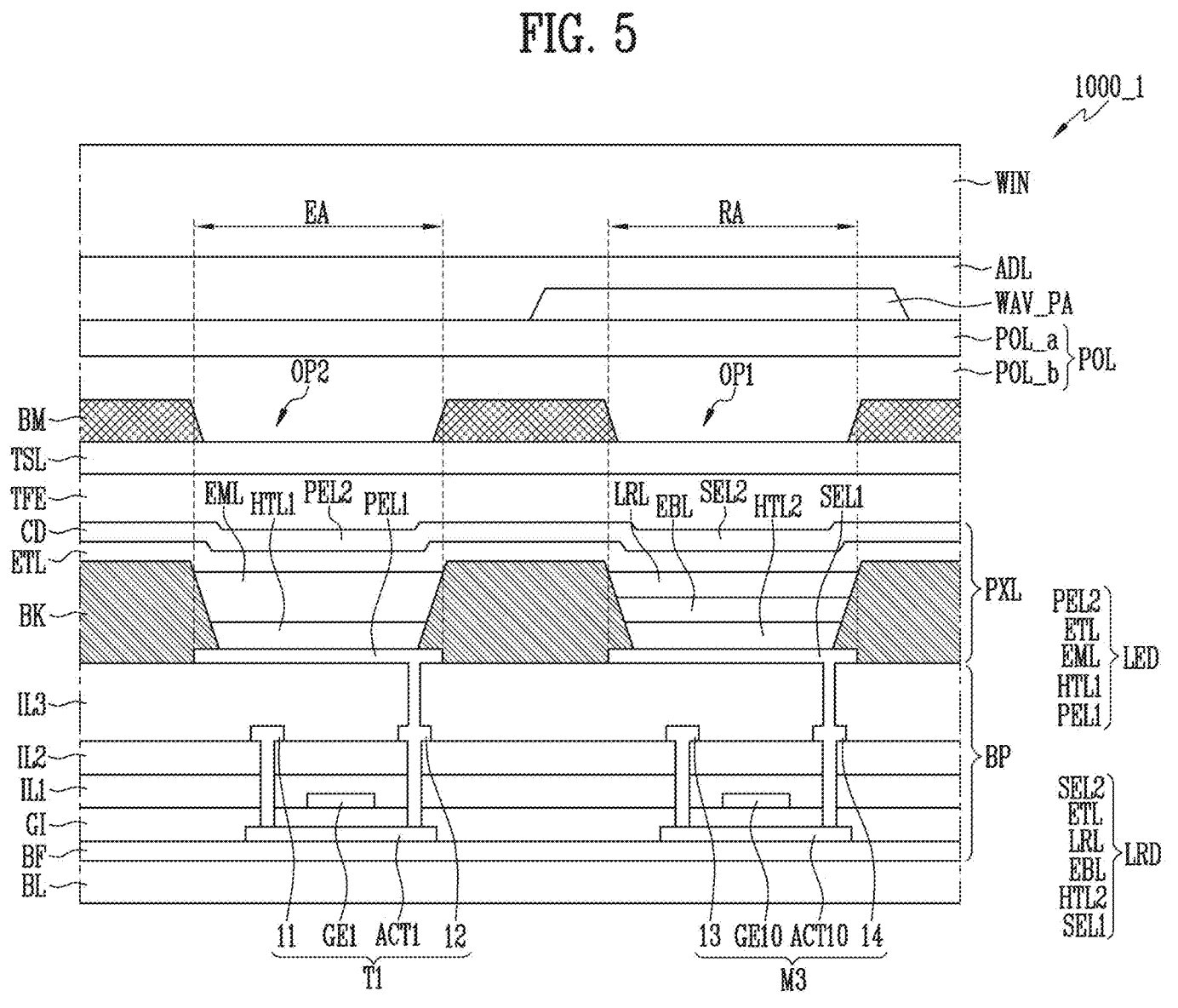

FIG. 5 is a cross-sectional view illustrating another embodiment of the display area of FIG. 1.

In the embodiment shown in FIG. 3, the wavelength plate WAV is disposed on an entirety or substantially on an entirety of the polarizing plate POL, but the embodiment shown in FIG. 5 may be different in that a wavelength pattern WAV_PA is disposed on a portion of the polarizing plate POL to correspond to an area overlapping with the first opening OP1 in a thickness direction.

According to an embodiment, the wavelength pattern WAV_PA may be disposed on the polarizing plate POL to overlap with the first opening OP1 in the thickness direction, and the area of the wavelength pattern WAV_PA may be greater than the area of the first opening OP1.

According to an embodiment, the wavelength pattern WAV_PA may delay a phase of incident light by 90 degrees (e.g., $\lambda/2$). As the wavelength pattern WAV_PA is interposed between the polarizing plate POL and the cover window WIN, interface reflection light generated by interfacial reflection of the light irradiated from the pixel layer PXL on an upper surface of the cover window WIN may be blocked from being incident in a direction of the base layer BL, and only scattered reflection light generated when the light emitted from the pixel layer PXL collides with a valley or a ridge of the fingerprint may be incident in the direction of the base layer BL. This is described in more detail below with reference to FIGS. 6A to 6C.

Figure 6A:
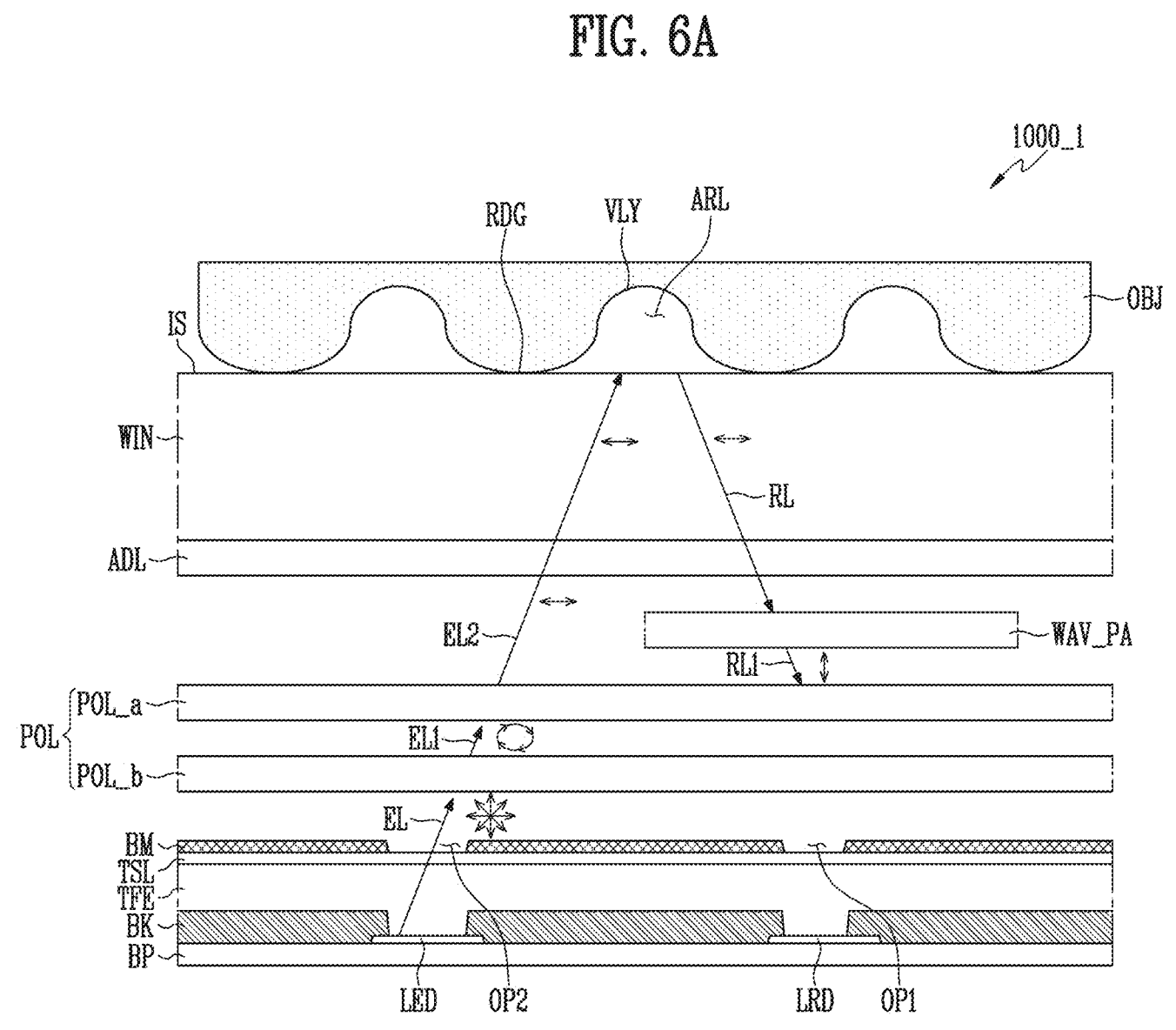
Figure 6B:
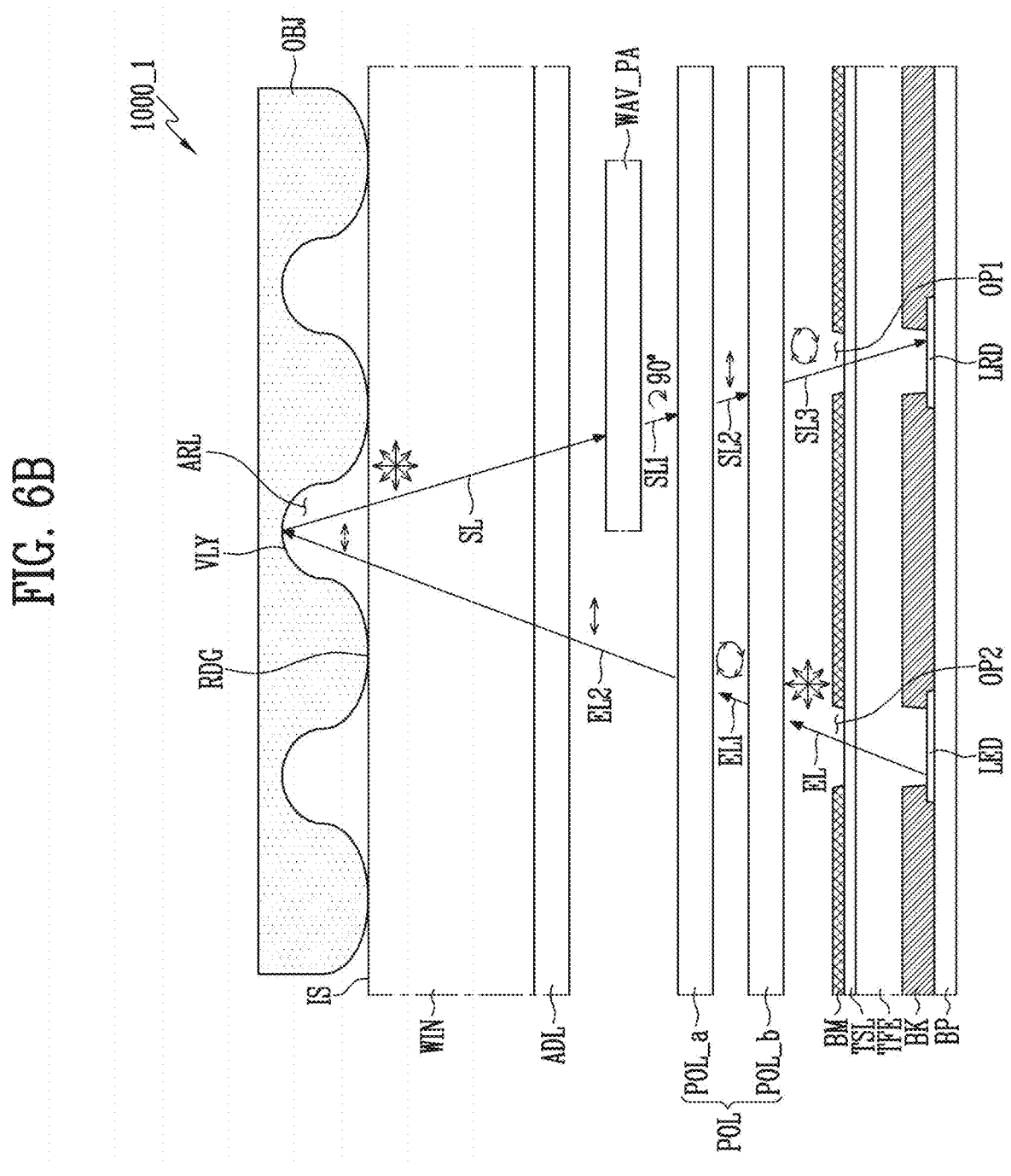
FIG. 6B is a diagram illustrating a path through which the scattered reflection light is incident on the light receiving element in the display device of FIG. 5.
Figure 6C:
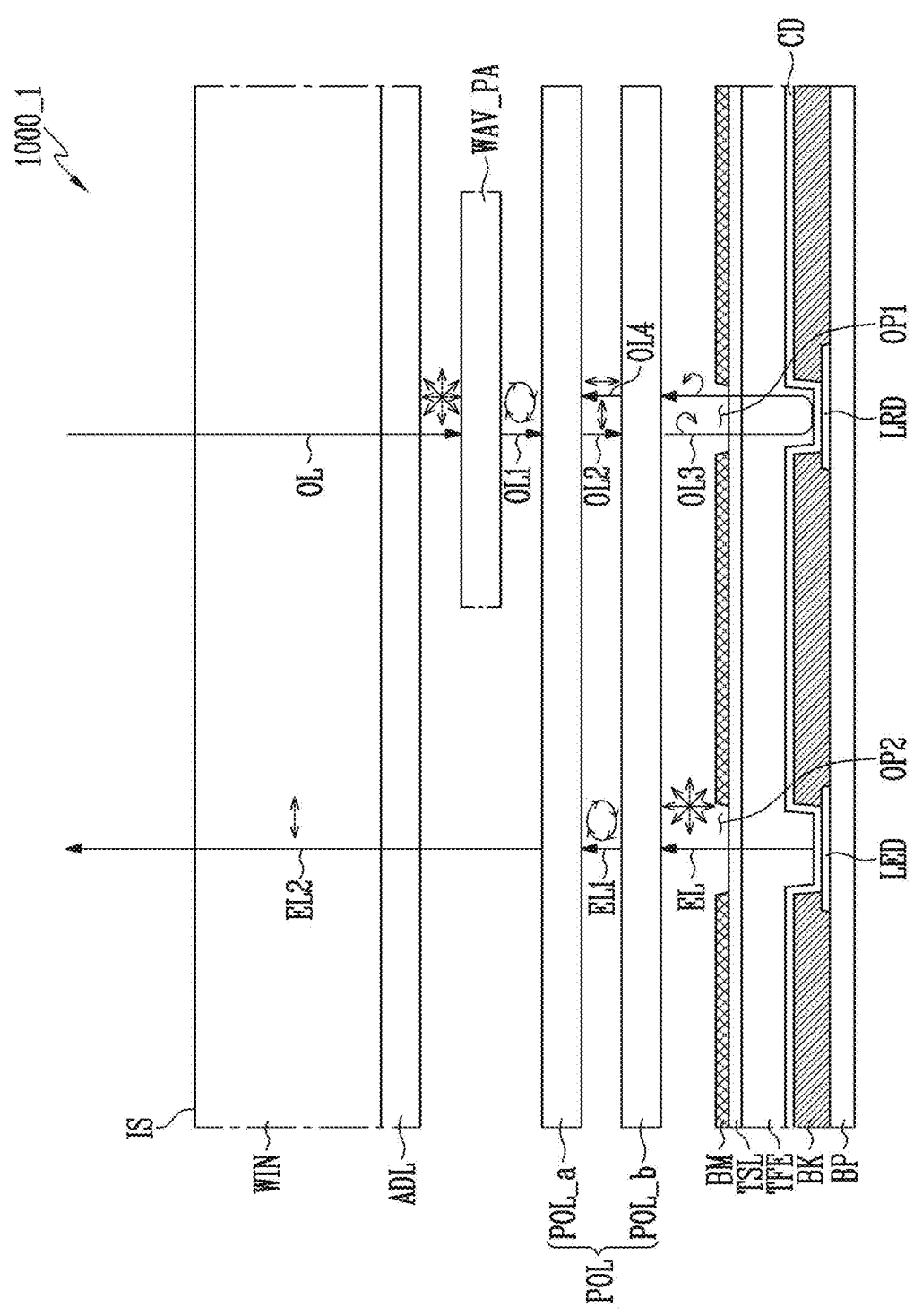
FIG. 6C is a diagram illustrating a path through which the light emitted from the light emitting element exits to a display surface, and a path through which external light reflection is blocked in the display device of FIG. 5.

FIG. 6A is a diagram illustrating a path through which the interface reflection light is removed in the display device of FIG. 5. FIG. 6B is a diagram illustrating a path through which the scattered reflection light is incident on the light receiving element in the display device of FIG. 5. FIG. 6C is a diagram illustrating a path through which the light emitted from the light emitting element exits to a display surface, and a path through which external light reflection is blocked in the display device of FIG. 5.

Referring to FIG. 6A, a phase of emission light EL emitted from the light emitting element LED may be delayed while the emission light EL passes through the phase retarder POL_b of the polarizing plate POL. For example, the phase retarder POL_b may delay the phase of the emission light EL by 45 degrees.

Light EU output from the phase retarder POL_b may be incident on the linear polarizer POL_a. The linear polarizer POL_a may transmit only a component vibrating in a 90 degree direction of a phase axis from among components of the light EL1. Accordingly, light EL2 output from the linear polarizer POL_a may vibrate in the 90 degree direction.

Unlike a ridge RDG of an object OBJ (e.g., a fingerprint of a finger) that is in contact with one surface of the cover window WIN, an air layer ARL may be interposed between a valley VLY of the object OBJ and the cover window WIN. The light EL2 output from the polarizing plate POL may be interface-reflected by a rapid refractive index difference between one surface (e.g., a display surface IS) of the cover window WIN and the air layer ARL, or in other words, a difference of a refractive index of an interface. The interface reflection light RL may have a phase of 90 degrees. The interface reflection light RL may be incident on the wavelength pattern WAV_PA, and the wavelength pattern WAV_PA may delay a phase of the interface reflection light RL by 90 degrees. Accordingly, light RL1 having a linear polarization of 180 degrees may be output from the wavelength pattern WAV_PA.

The light RL1 output from the wavelength pattern WAV_PA may be incident on the linear polarizer POL_a. However, the linear polarizer POL_a may transmit only a component vibrating in a 90 degree direction of a phase axis of incident light, or in other words, of the light RL1. However, because the light RL1 vibrates in a 180 degree direction, the light RL1 may not pass through the linear polarizer POL_a. According to such an optical mechanism, in the display device 1000 of FIG. 1 according to one or more embodiments of the present disclosure, the reflection light RL that is interface-reflected from the upper surface of the cover window WIN may be blocked.

Referring to FIG. 6B, the emission light EL emitted from the light emitting element LED may pass through the polarizing plate POL, as described above with reference to FIG. 6A. The light EL2 output from the polarizing plate POL may pass through a surface between one surface (e.g., the display surface IS) of the cover window WIN and the air layer ARL, or in other words, an interface, and may collide with the valley VLY or the ridge RDG of the object OBJ, and thus, may be scatter-reflected. The scattered reflection light SL may not only vibrate in a specific direction, like that of the light EL2 output from the polarizing plate POL, but may vibrate in multiple directions (e.g., all directions).

The scattered reflection light SL may be incident on the cover window WIN, and the scattered reflection light SL incident on the cover window WIN may be delayed by 90 degrees while passing through the wavelength pattern WAV_PA.

Light SL1 output from the wavelength pattern WAV_PA may be incident on the linear polarizer POL_a. The linear polarizer POL_a may transmit only a component vibrating in a 90 degree direction of a phase axis from among components of the light SL1. Accordingly, light SL2 output from the linear polarizer POL_a may vibrate in the 90 degree direction.

The light SL2 output from the linear polarizer POL_a may be incident on the phase retarder POL_b, and the phase retarder POL_b may delay a polarization state of the light SL2 having a linear polarization of 90 degrees by 45 degrees. Accordingly, light SL3 having a circular polarization of 135 degrees may be output from the phase retarder POL_b.

The light SL3 output from the polarizing plate POL may be provided to the light receiving element LRD through the first opening OP1 of the black matrix BM. The sensor driver 220 shown in FIG. 1 may detect biometric information, such as a user's fingerprint, based on a sensing signal received from the light receiving element LRD.

Referring to FIG. 6C, the emission light EL emitted from the light emitting element LED may pass through the polarizing plate POL, as described above with reference to FIG. 6A. The light EL2 output from the polarizing plate POL may pass through one surface of the cover window WIN, and may be emitted to the outside. In other words, the one surface of the cover window WIN may form the display surface IS.

External light OL may be incident on the cover window WIN from the outside. The external light OL may not only vibrate in a specific direction, but may vibrate in multiple directions (e.g., all directions).

The external light OL passing through the cover window WIN may be incident on the wavelength pattern WAV_PV. A phase of the external light OL may be delayed by 90 degrees while the external light OL passes through the wavelength pattern WAV_PV.

Light OL1 output from the wavelength pattern WAV_PV may be incident on the linear polarizer POL_a. The linear polarizer POL_a may transmit only a component vibrating in a 90 degree direction of a phase axis from among components of the light OL1. Accordingly, light OL2 output from the linear polarizer POL_a may vibrate in the 90 degree direction.

The light OL2 output from the linear polarizer POL_a may be incident on the phase retarder POL_b, and the phase retarder POL_b may delay a polarization state of the light OL2 having a linear polarization of 90 degrees by 45 degrees. Accordingly, light OL3 having a circular polarization of 135 degrees may be output from the phase retarder POL_b.

The light OL3 output from the polarizing plate POL may be reflected by the common electrode CD. The light OL3 reflected by the common electrode CD may have a phase of 135 degrees. The light OL3 may be incident on the phase retarder POL_b, and the phase retarder POL_b may delay a phase of the light OL3 by 45 degrees. Accordingly, light OL4 having a linear polarization of 180 degrees may be output from the phase retarder POL_b.

The light OL4 output from the phase retarder POL_b may be incident on the linear polarizer POL_a. However, the linear polarizer POL_a may transmit only a component vibrating in a 90 degree direction of a phase axis of incident light, or in other words, of the light OL4. However, because the light OL4 vibrates in a 180 degree direction, the light OL4 may not pass through the linear polarizer POL_a. According to such an optical mechanism, a display device 1000_1 according to one or more embodiments of the present disclosure may block external light reflection.

Figure 7A:
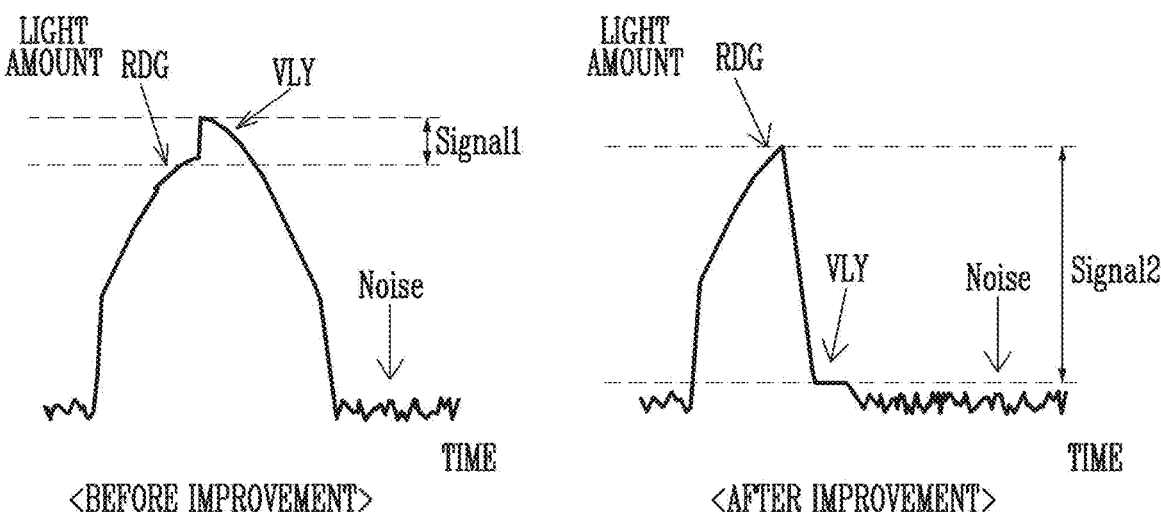
FIGS. 7A-7B are diagrams illustrating an effect according to embodiments of the present disclosure.
Figure 7B:
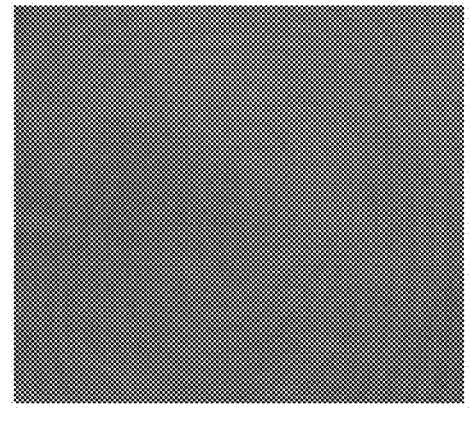
Figure 7B:
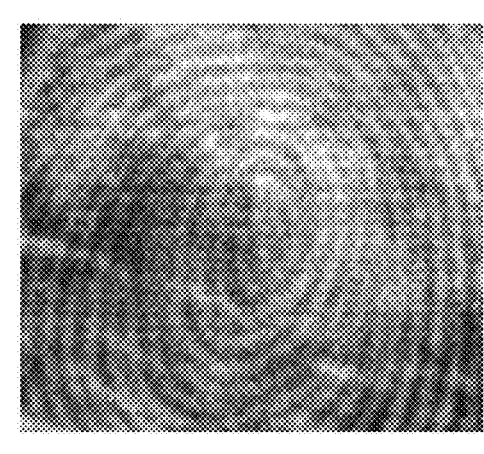

FIGS. 7A and 7B are diagrams illustrating an effect according to embodiments of the present disclosure.

Referring to FIGS. 1, 3, 5, and 7A, the sensor driver 220 may detect biometric information, such as a user's fingerprint, based on the sensing signal received from the photo sensors PHS including the light receiving element LRD. A fingerprint signal may be calculated from the sensing signal based on the difference of the light amount of the reflection light of the ridge RDG and the valley VLY of the fingerprint.

Both of the interface reflection light and the scattered reflection light may be generated from each of the ridge RDG and the valley VLY of the user's fingerprint placed on the cover window WIN. In this case, in an area of the cover window WIN corresponding to the ridge RDG of the fingerprint, because the air layer ARL is not interposed between the ridge RDG and one surface of the cover window WIN, a proportion of the scattered reflection light from among the interface reflection light and the scattered reflection light may be greater. In addition, in an area of the cover window WIN corresponding to the valley VLY of the fingerprint, because the air layer ARL is interposed between the valley VLY and one surface of the cover window WIN, a proportion of the interface reflection light from among the interface reflection light and the scattered reflection light may be greater.

A left graph shown in FIG. 7A illustrates a light amount difference of a comparative example, in which the display device 1000 does not include the wavelength plate WAV of FIG. 3 and the wavelength pattern WAV_PA of FIG. 5. A right graph shown in FIG. 7A illustrates a light amount difference according to embodiments of the present disclosure, in which the display device 1000 includes the wavelength plate WAV of FIG. 3 or the wavelength pattern WAV_PA of FIG. 5.

Referring to the left graph of FIG. 7A, in a display device that does not block the interface reflection light, because the light amount corresponding to the valley VLY of the fingerprint increases, the light amount difference between the valley VLY and the ridge RDG of the fingerprint may be small. Accordingly, a signal-to-noise ratio of the fingerprint signal may be reduced. When the signal-to-noise ratio is small, as shown in a left fingerprint image of FIG. 7B, contrast between the valley VLY and the ridge RDG of the fingerprint may not be clear.

Referring to the right graph of FIG. 7A, in the display devices 1000 and 1000_1 that block the interface reflection light by the wavelength plate WAV of FIG. 3 and the wavelength pattern WAV_PA of FIG. 5, because the light amount corresponding to the valley VLY of the fingerprint is significantly reduced, the light amount difference between the valley VLY and the ridge RDG of the fingerprint may increase. Accordingly, the signal-to-noise ratio of the fingerprint signal may increase. When the signal-to-noise ratio is large, as shown in a right fingerprint image of FIG. 7B, the contrast between the valley VLY and the ridge RDG of the fingerprint may be clear.

Figure 8:
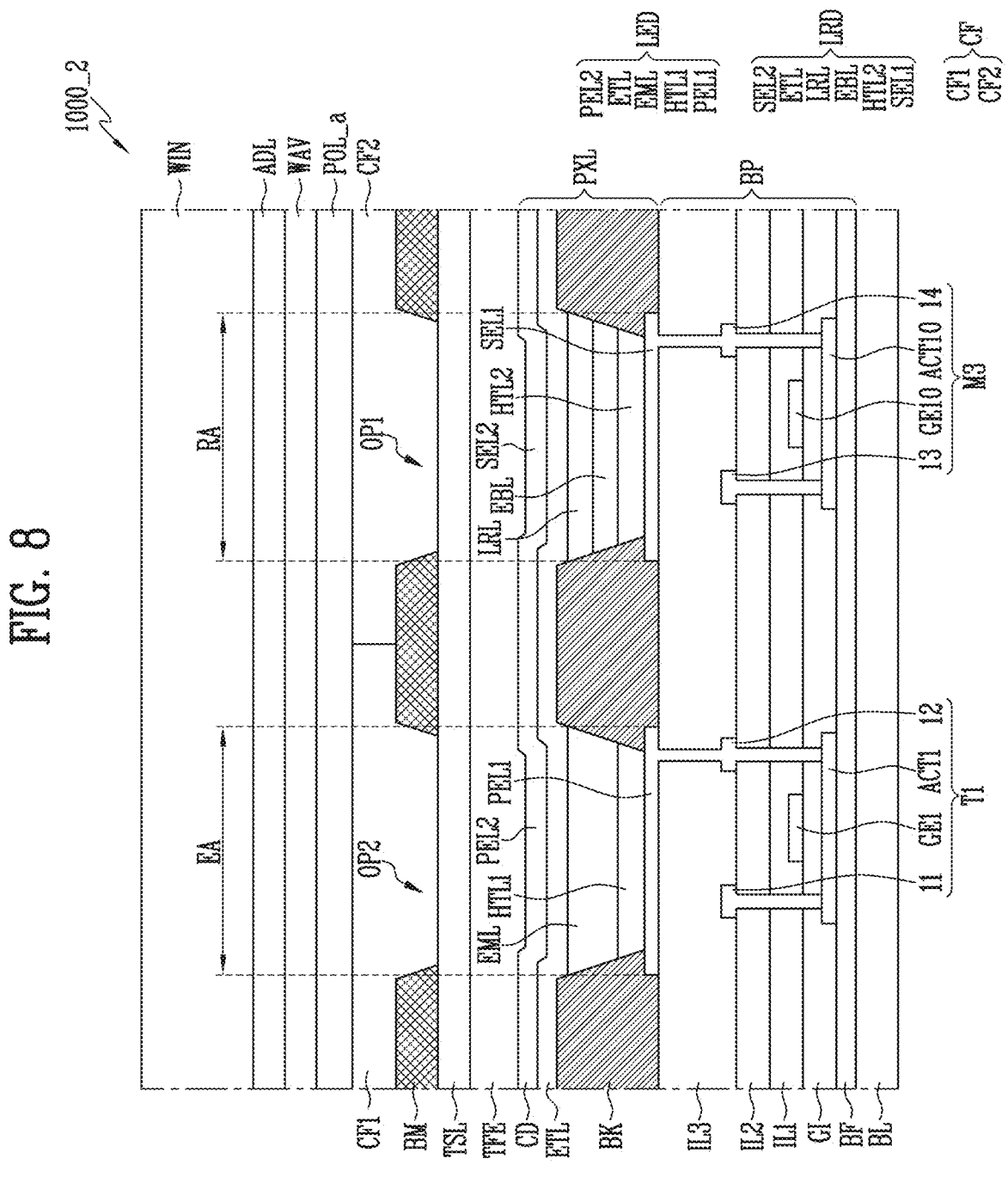
FIG. 8 is a cross-sectional view illustrating another embodiment of the display area of FIG. 1.

FIG. 8 is a cross-sectional view illustrating another embodiment of the display area of FIG. 1.

In the embodiment shown in FIG. 3, the phase retarder POL_b and the linear polarizer POL_a are sequentially stacked on the touch sensor layer TSL and the black matrix BM, but the embodiment shown in FIG. 8 may be different in that a color filter CF is disposed on the touch sensor layer TSL and the black matrix BM, and only the linear polarizer POL_a from among the phase retarder POL_b and the linear polarizer POL_a is disposed on the color filter CF.

In more detail, the first color filter CF1 may be one of a red color filter, a green color filter, or a blue color filter according to a color of light emitted from the light emitting area EA. For example, when green light is output from the light emitting area EA, the first color filter CF1 may be the green color filter.

In an embodiment, the color filters CF1 and CF2 may directly contact at least some of an upper surface and a side surface of the black matrix BM. For example, the color filters CF1 and CF2 may be directly disposed on the black matrix BM. As another example, a material other than a bonding member for bonding the color filters CF1 and CF2 and the black matrix BM is not interposed.

The first color filter CF1 may selectively pass light therethrough emitted from the light emitting element LED according to a wavelength or color of the light. When the black matrix BM and the color filters CF1 and CF2 are disposed on the touch sensor layer TSL, external light reflection may be sufficiently prevented without a separate polarization layer having a thickness of generally 80 μm or more. In other words, because the color filters CF1 and CF2 absorb external light and block the external light through the black matrix BM, the external light reflection may be prevented or substantially prevented even though the phase retarder POL_b of the polarizing plate POL is omitted.

In an embodiment, the second color filter CF2 may be provided to overlap with the light receiving area RA. The second color filter CF2 may be one of a red color filter, a green color filter, or a blue color filter according to a color of light sensed by the light receiving layer LRL. For example, when the light receiving layer LRL absorbs light of a green wavelength band, the second color filter CF2 may be the green color filter. In other words, the second color filter CF2 may be set regardless of a light emission color of adjacent pixels.

The wavelength plate WAV may delay a phase of incident light by 45 degrees (e.g., λ/4). As the wavelength plate WAV is interposed between the polarizing plate POL and the cover window WIN, interface reflection light generated by interfacial reflection of the light irradiated from the pixel layer PXL on an upper surface of the cover window WIN may be blocked from being incident in a direction of the base layer BL, and only scattered reflection light generated when the light emitted from the pixel layer PXL collides with a valley or a ridge of the fingerprint may be incident in the direction of the base layer BL. This is described in more detail below with reference to FIGS. 9A and 9B.

Figure 9A:
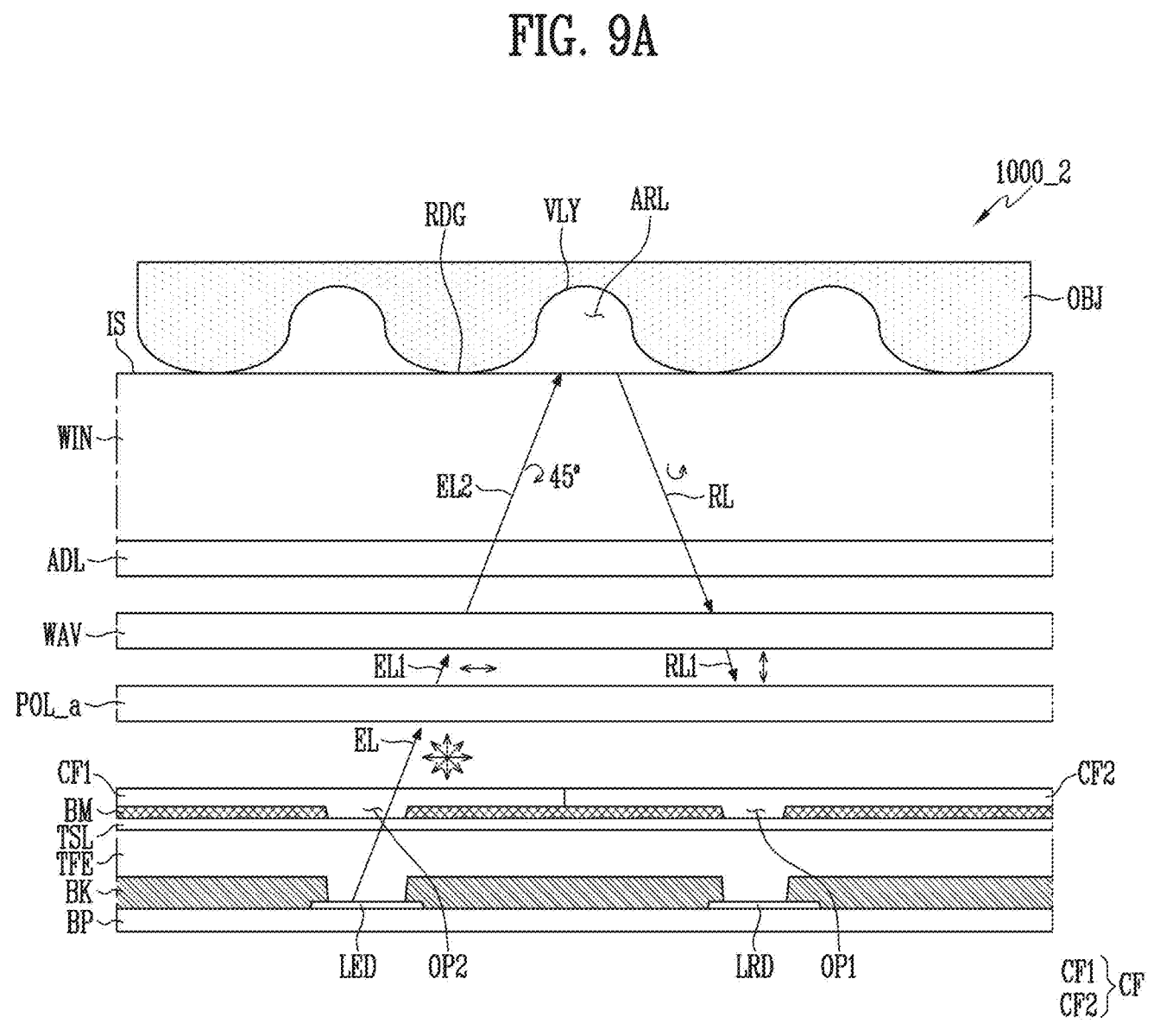
Figure 9B:
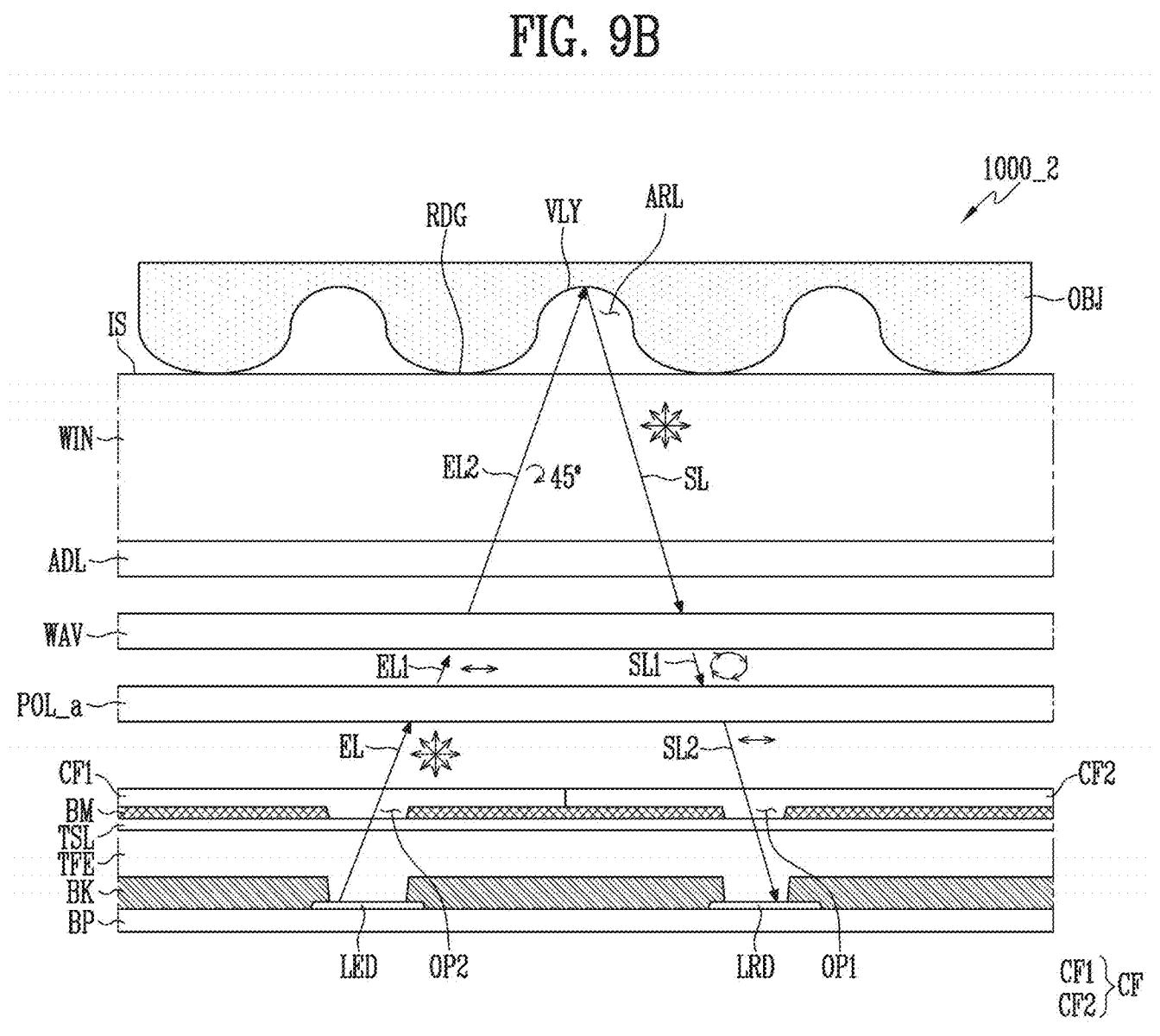

FIG. 9A is a diagram illustrating a path through which the interface reflection light is removed in the display device of FIG. 8. FIG. 9B is a diagram illustrating a path through which the scattered reflection light is incident on the light receiving element in the display device of FIG. 8.

Referring to FIG. 9A, emission light EL emitted from the light emitting element LED may be incident on the linear polarizer POL_a. The linear polarizer POL_a may transmit only a component vibrating in a 90 degree direction of a phase axis from among components of the light EL. Accordingly, light EL1 output from the linear polarizer POL_a may vibrate in the 90 degree direction.

The wavelength plate WAV (e.g., the phase retarder) that delays the phase of light by 45 degrees may delay a polarization state of the light EL1 having a linear polarization of 90 degrees by 45 degrees. Accordingly, light EL2 having a circular polarization of 135 degrees may be output from the wavelength plate WAV.

Unlike a ridge RDG of an object OBJ (e.g., a fingerprint of a finger) that is in contact with one surface of the cover window WIN, an air layer ARL may be interposed between a valley VLY of the object OBJ and the cover window WIN. The light EL2 output from the wavelength plate WAV may be interface-reflected by a rapid refractive index difference between one surface (e.g., a display surface IS) of the cover window WIN and the air layer ARL, or in other words, a difference of a refractive index of an interface. The interface reflection light RL may have a phase of 135 degrees. The interface reflection light RL may be incident on the wavelength plate WAV, and the wavelength plate WAV may delay a phase of the interface reflection light RL by 45 degrees. Accordingly, light RL1 having a linear polarization of 180 degrees may be output from the wavelength plate WAV.

The light RL1 output from the wavelength plate WAV may be incident on the linear polarizer POL_a. However, the linear polarizer POL_a may transmit only a component vibrating in a 90 degree direction of a phase axis of incident light, or in other words, of the light RL1. However, because the light RL1 vibrates in a 180 degree direction, the light RL1 may not pass through the linear polarizer POL_a. According to such an optical mechanism, in the display device 1000 of FIG. 1 according to one or more embodiments of the present disclosure, the reflection light RL that is interface-reflected from the upper surface of the cover window WIN may be blocked.

Referring to FIG. 9B, the emission light EL emitted from the light emitting element LED may pass through the linear polarizer POL_a and the wavelength plate WAV, as described above with reference to FIG. 9A. The light EL2 output from the wavelength plate WAV may pass through a surface between one surface (e.g., the display surface IS) of the cover window WIN and the air layer ARL, or in other words, an interface, and may collide with the valley VLY or the ridge RDG of the object OBJ, and thus, may be scatter-reflected. The scattered reflection light SL may not only vibrate in a specific direction, like that of the light EL2 output from the wavelength plate WAV, but may vibrate in multiple directions (e.g., all directions).

The scattered reflection light SL may be incident on the cover window WIN, and the scattered reflection light SL incident on the cover window WIN may be delayed by 45 degrees while passing through the wavelength plate WAV.

Light SL1 output from the wavelength plate WAV may be incident on the linear polarizer POL_a. The linear polarizer POL_a may transmit only a component vibrating in a 90 degree direction of a phase axis from among components of the light SL1. Accordingly, light SL2 output from the linear polarizer POL_a may vibrate in the 90 degree direction.

The light SL2 output from the linear polarizer POL_a may be provided to the light receiving element LRD through the first opening OP1 of the black matrix BM. The sensor driver 220 shown in FIG. 1 may detect biometric information, such as a user's fingerprint, based on a sensing signal received from the light receiving element LRD.

As described above, in a display device 1000_2 that blocks the interface reflection light by the wavelength plate WAV, because the light amount corresponding to the valley VLY of the fingerprint may be significantly reduced, the light amount difference between the valley VLY and the ridge RDG of the fingerprint may increase. Accordingly, the signal-to-noise ratio of the fingerprint signal may increase. When the signal-to-noise ratio is large, the contrast between the valley VLY and the ridge RDG of the fingerprint may be clear.

Further, because the external light incident from the outside is absorbed by the color filters CF1 and CF2 or blocked through the black matrix BM, the external light reflection may be prevented or substantially prevented even though the phase retarder POL_b shown in FIG. 3 of the polarizing plate POL is omitted.

Figure 10:
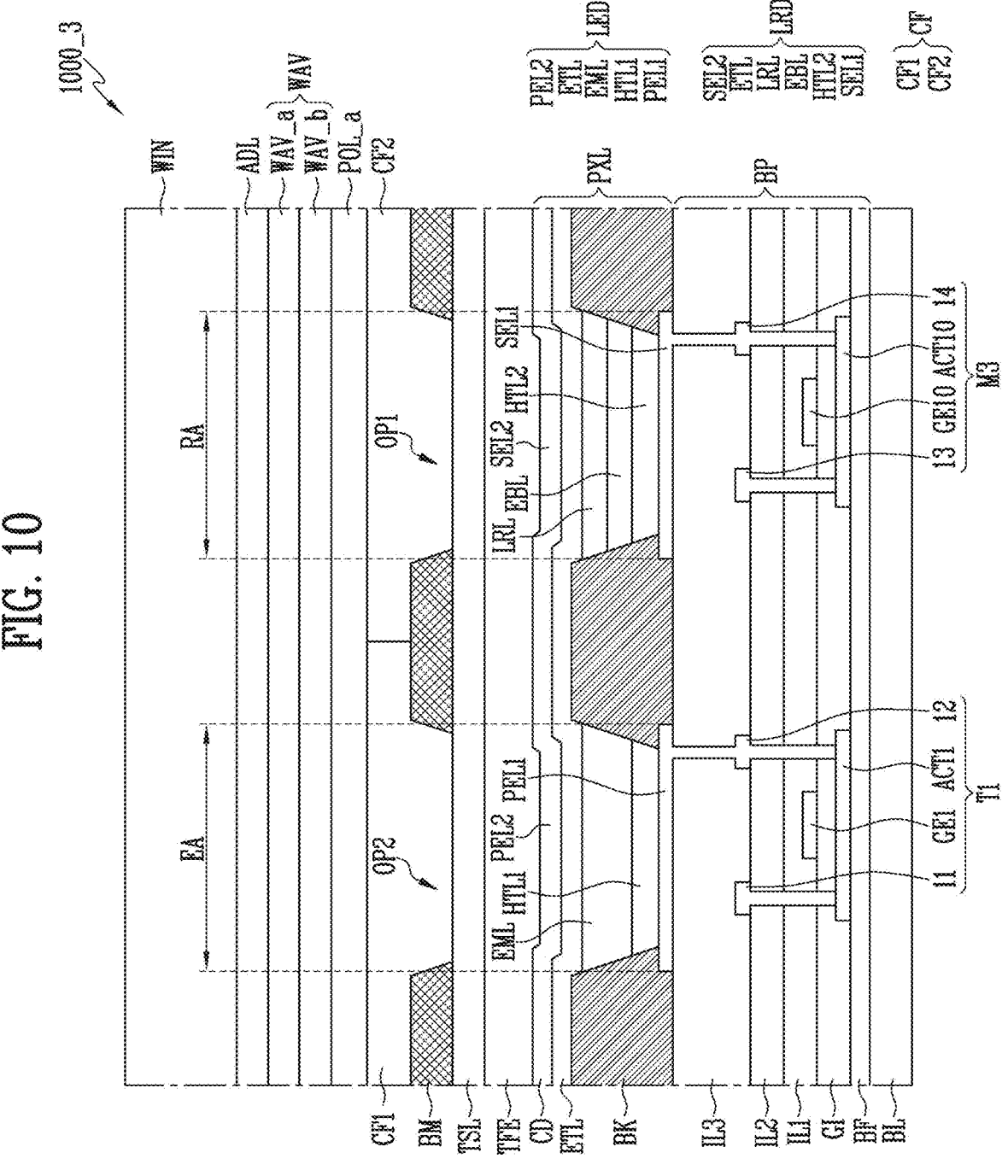
FIG. 10 is a cross-sectional view illustrating another embodiment of the display area of FIG. 1.

FIG. 10 is a cross-sectional view illustrating another embodiment of the display area of FIG. 1.

The embodiment shown in FIG. 10 may be different from the embodiment shown in FIG. 8, which includes only the wavelength plate WAV that delays the phase of the light incident on the linear polarizer POL_a by 45 degrees, in that the embodiment shown in FIG. 10 includes a first wavelength plate WAV_a, and further includes a second wavelength plate WAV_b between the linear polarizer POL_a and the first wavelength plate WAV_a. The first wavelength plate WAV_a may delay a phase of incident light by 45 degrees, and the second wavelength plate WAV_b may delay a phase of incident light by 90 degrees.

The wavelength plate WAV may delay a phase of incident light. As the wavelength plate WAV is interposed between the linear polarizer POL_a and the cover window WIN, interface reflection light generated by interfacial reflection of the light irradiated from the pixel layer PXL on an upper surface of the cover window WIN may be blocked from being incident in a direction of the base layer BL, and only scattered reflection light generated when the light emitted from the pixel layer PXL collides with a valley or a ridge of the fingerprint may be incident in the direction of the base layer BL. This is described in more detail below with reference to FIGS. 11A and 11B.

Figure 11B:
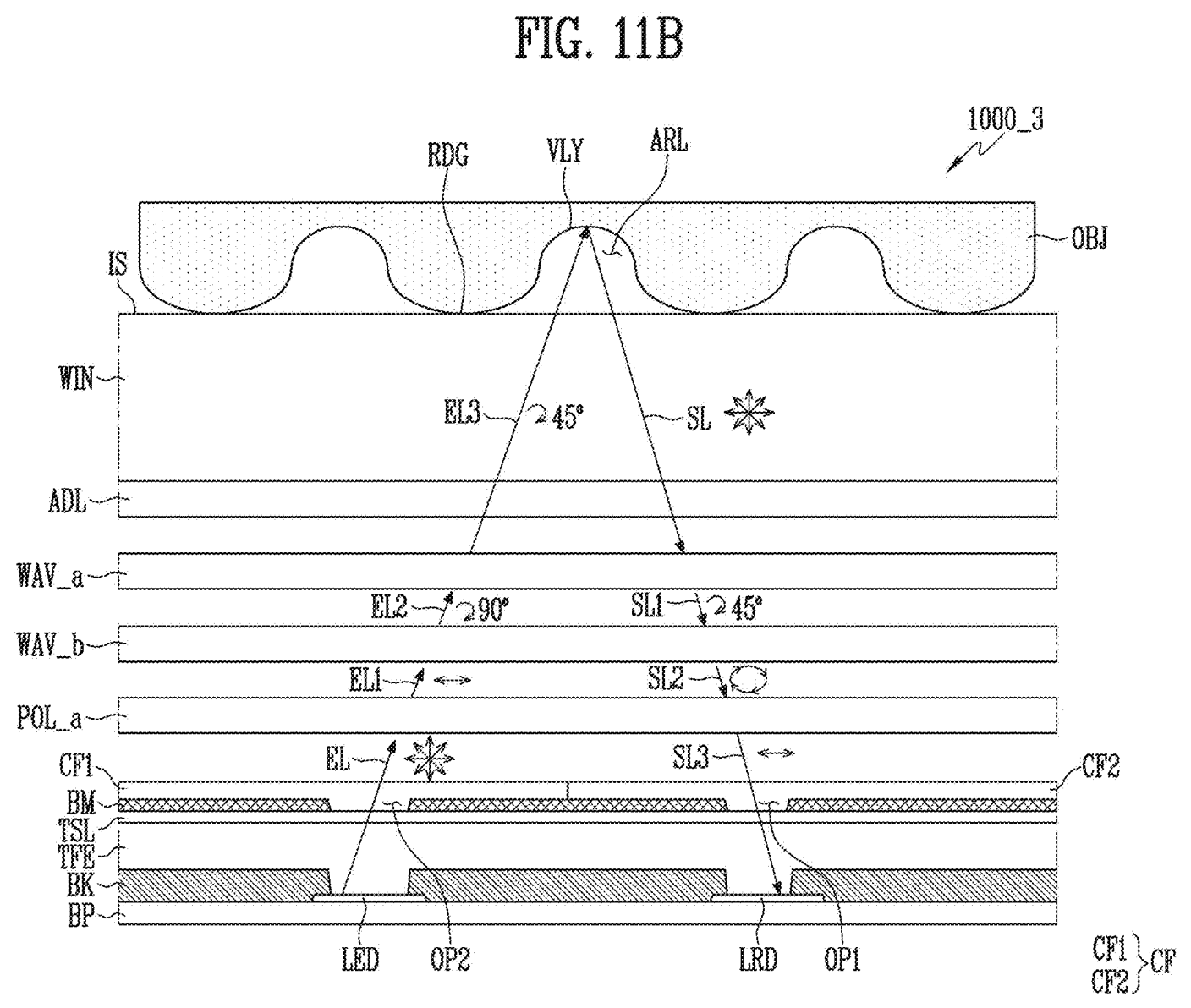

FIG. 11A is a diagram illustrating a path through which the interface reflection light is removed in the display device of FIG. 10. FIG. 11B is a diagram illustrating a path through which the scattered reflection light is incident on the light receiving element in the display device of FIG. 10.

Referring to FIG. 11A, emission light EL emitted from the light emitting element LED may be incident on the linear polarizer POL_a. The linear polarizer POL_a may transmit only a component vibrating in a 90 degree direction of a phase axis from among components of the emission light EL. Accordingly, light EL1 output from the linear polarizer POL_a may vibrate in the 90 degree direction.

The second wavelength plate WAV_b (e.g., a phase retarder) that delays a phase of light by 90 degrees may delay a polarization state of the light EL1 having a linear polarization of 90 degrees by 90 degrees. Accordingly, light EL2 having a circular polarization of 180 degrees may be output from the second wavelength plate WAV_b.

The light EL2 may be incident on the first wavelength plate WAV_a. The first wavelength plate WAV_a (e.g., a phase retarder) that delays a phase of light by 45 degrees may delay a polarization state of the light EL2 having a circular polarization of 180 degrees by 45 degrees. Accordingly, light EL3 having a circular polarization of 225 degrees may be output from the wavelength plate WAV.

Unlike a ridge RDG of an object OBJ (e.g., a fingerprint of a finger) that is in contact with one surface of the cover window WIN, an air layer ARL may be interposed between a valley VLY of the object OBJ and the cover window WIN. The light EL3 output from the wavelength plate WAV may be interface-reflected by a rapid refractive index difference between one surface (e.g., a display surface IS) of the cover window WIN and the air layer ARL, or in other words, a difference of a refractive index of an interface. The interface reflection light RL may have a phase of 225 degrees. The interface reflection light RL may be incident on the first wavelength plate WAV_a, and the first wavelength plate WAV_a may delay a phase of the interface reflection light RL by 45 degrees. Accordingly, light RL1 having a linear polarization of 270 degrees may be output from the first wavelength plate WAV_a.

The light RL1 output from the first wavelength plate WAV_a may be incident on the second wavelength plate WAV_b, and the second wavelength plate WAV_b may delay a phase of the light RL1 by 90 degrees. Accordingly, light RL2 having a linear polarization of 360 degrees may be output from the second wavelength plate WAV_b.

The light RL2 output from the wavelength plate WAV may be incident on the linear polarizer POL_a. However, the linear polarizer POL_a may transmit only a component vibrating in a 90 degree direction of a phase axis of incident light, or in other words, of the light RL2. However, because the light RL1 vibrates in a 360 degree direction, the light RL2 may not pass through the linear polarizer POL_a. According to such an optical mechanism, in a display device 1000_3 according to one or more embodiments of the present disclosure, the interface reflection light RL that is reflected from the upper surface of the cover window WIN may be blocked.

Referring to FIG. 11B, the emission light EL emitted from the light emitting element LED may pass through the linear polarizer POL_a and the wavelength plate WAV, as described above with reference to FIG. 11A. The light EL3 output from the wavelength plate WAV may pass through a surface between one surface (e.g., the display surface IS) of the cover window WIN and the air layer ARL, or in other words, an interface, and may collide with the valley VLY or the ridge RDG of the object OBJ, and thus, may be scatter-reflected. The scattered reflection light SL may not only vibrate in a specific direction, like that of the light EL3 output from the wavelength plate WAV, but may vibrate in multiple directions (e.g., all directions).

The scattered reflection light SL may be incident on the cover window WIN, and the scattered reflection light SL incident on the cover window WIN may be delayed by 45 degrees while passing through the first wavelength plate WAV_a.

The light SL1 output from the first wavelength plate WAV_a may be incident on the second wavelength plate WAV_b. A phase of the light SL1 may be delayed by 90 degrees while the light SL1 passes through the second wavelength plate WAV_b.

Light SL2 output from the second wavelength plate WAV_b may be incident on the linear polarizer POL_a. The linear polarizer POL_a may transmit only a component vibrating in a 90 degree direction of a phase axis from among components of the light SL2. Accordingly, light SL3 output from the linear polarizer POL_a may vibrate in the 90 degree direction.

The light SL3 output from the linear polarizer POL_a may be provided to the light receiving element LRD through the first opening OP1 of the black matrix BM. The sensor driver 220 shown in FIG. 1 may detect biometric information, such as a user's fingerprint, based on a sensing signal received from the light receiving element LRD.

As described above, in the display device 1000_3 that blocks the interface reflection light by the first wavelength plate WAV_a and the second wavelength plate WAV_b, because the light amount corresponding to the valley VLY of the fingerprint is significantly reduced, the light amount difference between the valley VLY and the ridge RDG of the fingerprint may increase. Accordingly, the signal-to-noise ratio of the fingerprint signal may increase. When the signal-to-noise ratio is large, the contrast between the valley VLY and the ridge RDG of the fingerprint may be clear.

Because the external light incident from the outside is absorbed by the color filters CF1 and CF2 or blocked through the black matrix BM, the external light reflection may be prevented or substantially prevented even though the phase retarder POL_b of FIG. 3 of the polarizing plate POL is omitted.

The electronic or electric devices and/or any other relevant devices or components according to embodiments of the present disclosure described herein (e.g., the driving circuit, the panel driver, the sensor driver, and/or the like) may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a base layer;
a pixel layer on the base layer, and comprising a light emitting element and a light receiving element;
an encapsulation layer covering the pixel layer;
a black matrix on the encapsulation layer, and having a first opening corresponding to the light receiving element, and a second opening corresponding to the light emitting element;
a color filter on the black matrix, overlapping with the light receiving element in the first opening and the light emitting element in the second opening, and located between the first opening and the second opening on a top surface of the black matrix;
a linear polarizer on the color filter;
a first wavelength plate on the linear polarizer, and configured to delay a phase of light; and
a window on the first wavelength plate.

2. The display device according to claim 1, wherein the first wavelength plate is configured to delay the phase of light by 45 degrees.

3. The display device according to claim 1, wherein the linear polarizer is configured to transmits only a component from among components of light that vibrates in a 90 degree direction of a phase axis.

4. The display device according to claim 3, wherein the linear polarizer is located between the color filter and the first wavelength plate.

5. The display device according to claim 1, further comprising:
a second wavelength plate between the first wavelength plate and the linear polarizer.

6. The display device according to claim 5, wherein the second wavelength plate is configured to delay a phase of light by 90 degrees.

7. The display device according to claim 1, wherein the color filter comprises:
a first color filter corresponding to the light emitting element; and
a second color filter corresponding to the light receiving element.

8. The display device according to claim 7, wherein the first color filter is any one of a red color filter, a green color filter, or a blue color filter according to a color of light emitted from the light emitting element, and the second color filter is the green color filter.

9. The display device according to claim 1, further comprising:
a touch sensor layer between the encapsulation layer and the black matrix.

10. The display device according to claim 1, further comprising:
an adhesive layer between the first wavelength plate and the window.

11. The display device according to claim 1, further comprising:
a panel driver configured to supply a driving signal for fingerprint sensing to the light emitting element; and
a sensor driver configured to calculate a fingerprint signal based on a difference between a light amount corresponding to a ridge of a fingerprint and a light amount corresponding to a valley of the fingerprint from a sensing signal received from the light receiving element.

12. The display device according to claim 11, wherein the light amount corresponding to the ridge of the fingerprint is greater than a reflection light amount corresponding to the valley of the fingerprint.

* * * * *